United States Patent
Mabuchi

(10) Patent No.: US 9,866,771 B2
(45) Date of Patent: Jan. 9, 2018

(54) SOLID-STATE IMAGING DEVICE, SIGNAL PROCESSING METHOD OF SOLID-STATE IMAGING DEVICE, AND ELECTRONIC APPARATUS

(71) Applicant: Sony Corporation, Tokyo (JP)

(72) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/432,565

(22) Filed: Feb. 14, 2017

(65) Prior Publication Data

US 2017/0155858 A1    Jun. 1, 2017

Related U.S. Application Data

(60) Continuation of application No. 14/845,738, filed on Sep. 4, 2015, now Pat. No. 9,681,070, which is a (Continued)

(30) Foreign Application Priority Data

Apr. 7, 2009   (JP) ................................. 2009-092854

(51) Int. Cl.
*H04N 5/374*   (2011.01)
*H04N 5/378*   (2011.01)
(Continued)

(52) U.S. Cl.
CPC ..... *H04N 5/35563* (2013.01); *H01L 27/1464* (2013.01); *H01L 27/14607* (2013.01);
(Continued)

(58) Field of Classification Search
CPC ........... H04N 5/35563; H04N 5/35545; H04N 5/35536; H04N 5/2355; H04N 5/23229; H04N 5/37213; H01L 27/1464; H01L 27/14621; H01L 27/14627; H01L 27/14641
See application file for complete search history.

(56) References Cited

U.S. PATENT DOCUMENTS 5,778,106 A * 7/1998 Juenger .................. H04N 1/482
                                                        348/E9.01
6,046,772 A * 4/2000 Howell .................. H04N 1/486
                                                        348/219.1
(Continued)

FOREIGN PATENT DOCUMENTS

FR         2968877 A1 *  6/2012
JP       11150687 A *   6/1999
(Continued)

*Primary Examiner* — John Villecco
(74) *Attorney, Agent, or Firm* — Sheridan Ross P.C.

(57) ABSTRACT

A solid-state imaging device includes a pixel array section and a signal processing section. The pixel array section is configured to include a plurality of arranged rectangular pixels, each of which has different sizes in the vertical and horizontal directions, and a plurality of adjacent ones of which are combined to form a square pixel having the same size in the vertical and horizontal directions. The signal processing section is configured to perform a process of outputting, as a single signal, a plurality of signals read out from the combined plurality of rectangular pixels.

3 Claims, 23 Drawing Sheets

Related U.S. Application Data continuation of application No. 14/508,327, filed on Oct. 7, 2014, now Pat. No. 9,185,318, which is a continuation of application No. 14/052,316, filed on Oct. 11, 2013, now Pat. No. 8,878,959, which is a division of application No. 12/731,402, filed on Mar. 25, 2010, now Pat. No. 8,576,299.

(51) Int. Cl.

| | | |
|---|---|---|
| *H04N 5/232* | (2006.01) | |
| *H04N 5/372* | (2011.01) | |
| *H01L 27/146* | (2006.01) | |
| *H04N 5/355* | (2011.01) | |
| *H04N 5/357* | (2011.01) | |
| *H04N 5/363* | (2011.01) | |
| *H04N 5/365* | (2011.01) | |
| *H04N 5/376* | (2011.01) | |

(52) U.S. Cl.
CPC ..... *H01L 27/14627* (2013.01); *H04N 5/3575* (2013.01); *H04N 5/363* (2013.01); *H04N 5/365* (2013.01); *H04N 5/378* (2013.01); *H04N 5/3742* (2013.01); *H04N 5/3765* (2013.01)

(56) References Cited

U.S. PATENT DOCUMENTS

| | | | |
|---|---|---|---|
| 6,111,608 A * | 8/2000 | Koizumi | H04N 5/2254 348/335 |
| 6,232,590 B1 * | 5/2001 | Baek | H01L 27/14627 250/208.1 |
| 6,657,665 B1 * | 12/2003 | Guidash | H01L 27/14603 257/E27.131 |
| 6,787,824 B2 * | 9/2004 | Takeuchi | H01L 27/14627 257/257 |
| 6,803,958 B1 * | 10/2004 | Wang | H04N 5/243 348/308 |
| 7,256,382 B2 * | 8/2007 | Yahazu | H04N 5/347 250/208.1 |
| 7,408,443 B2 * | 8/2008 | Nam | H04N 5/3653 340/308 |
| 7,480,000 B2 * | 1/2009 | Oda | H04N 9/045 348/220.1 |
| 7,745,779 B2 * | 6/2010 | Conners | H04N 5/2351 250/208.1 |
| 7,787,040 B2 * | 8/2010 | Oda | H04N 9/045 348/220.1 |
| 8,018,516 B2 * | 9/2011 | Hirai | H04N 5/3559 348/308 |
| 8,098,311 B2 * | 1/2012 | Mabuchi | H01L 27/14621 348/294 |
| 8,102,435 B2 * | 1/2012 | Castorina | H04N 5/2353 348/222.1 |
| 9,083,892 B2 * | 7/2015 | Komaba | H03M 1/56 |
| 9,237,282 B2 * | 1/2016 | Kanemitsu | H04N 5/35563 |
| 9,728,565 B2 * | 8/2017 | Fossum | H01L 27/1461 |
| 2005/0092894 A1 * | 5/2005 | Fossum | H01L 27/14609 250/208.1 |
| 2006/0094151 A1 * | 5/2006 | Sumi | H01L 27/14621 438/57 |
| 2006/0245014 A1 * | 11/2006 | Haneda | H04N 1/3871 358/512 |
| 2007/0010711 A1 * | 1/2007 | Hasegawa | A61B 1/00096 600/168 |
| 2007/0014019 A1 * | 1/2007 | Mouli | G02B 3/0018 359/619 |
| 2007/0035653 A1 * | 2/2007 | Hong | G06T 5/50 348/340 |
| 2007/0268374 A1 * | 11/2007 | Robinson | H04N 3/1587 348/222.1 |
| 2007/0268375 A1 * | 11/2007 | Robinson | H04N 5/217 348/222.1 |
| 2008/0049112 A1 * | 2/2008 | Lee | H01L 27/14603 348/222.1 |
| 2008/0117321 A1 * | 5/2008 | Muramatsu | H04N 3/155 348/308 |
| 2008/0173794 A1 * | 7/2008 | Oike | H04N 5/35554 250/208.1 |
| 2008/0191299 A1 * | 8/2008 | Parks | H01L 27/14632 257/432 |
| 2008/0218598 A1 * | 9/2008 | Harada | H04N 5/2353 348/222.1 |
| 2008/0266434 A1 * | 10/2008 | Sugawa | H01L 27/14609 348/308 |
| 2008/0297609 A1 * | 12/2008 | Song | H04N 3/155 348/207.99 |
| 2009/0309999 A1 * | 12/2009 | Hirai | H04N 5/3559 348/241 |
| 2009/0310004 A1 * | 12/2009 | Parks | H01L 27/14603 348/308 |
| 2010/0025788 A1 * | 2/2010 | Konishi | H01L 27/14627 257/432 |
| 2010/0328479 A1 * | 12/2010 | Sambongi | H04N 5/35563 348/222.1 |
| 2011/0074995 A1 * | 3/2011 | Rafferty | H04N 5/35563 348/308 |
| 2011/0141333 A1 * | 6/2011 | Naruse | H01L 27/14621 348/308 |
| 2011/0215223 A1 * | 9/2011 | Unagami | H01L 27/148 250/208.1 |
| 2011/0221947 A1 * | 9/2011 | Awazu | G02B 3/0043 348/311 |
| 2013/0076953 A1 * | 3/2013 | Sekine | H04N 5/343 348/311 |
| 2013/0127002 A1 * | 5/2013 | Okigawa | H01L 27/14627 257/432 |
| 2013/0161774 A1 * | 6/2013 | Okigawa | G02B 3/0056 257/432 |
| 2014/0375852 A1 * | 12/2014 | Ogino | H01L 27/14627 348/294 |
| 2015/0228687 A1 * | 8/2015 | Numata | H01L 27/14627 257/432 |
| 2015/0229833 A1 * | 8/2015 | Numata | H04N 5/3696 348/294 |

FOREIGN PATENT DOCUMENTS

| | | | | | |
|---|---|---|---|---|---|
| JP | 2000023041 A | * | 1/2000 | ........ | H04N 5/37452 |
| JP | 2002199284 A | * | 7/2002 | | |
| JP | 2003018446 A | * | 1/2003 | | |
| JP | 2004159274 A | * | 6/2004 | | |
| JP | 2005328493 A | * | 11/2005 | ....... | H01L 27/14609 |
| JP | 2006237772 A | * | 9/2006 | | |
| JP | 2007189085 A | * | 7/2007 | | |

* cited by examiner

| G | B | G | B | G | B | G | B |
|---|---|---|---|---|---|---|---|
| G | B | G | B | G | B | G | B |
| R | G | R | G | R | G | R | G |
| R | G | R | G | R | G | R | G |
| G | B | G | B | G | B | G | B |
| G | B | G | B | G | B | G | B |
| R | G | R | G | R | G | R | G |
| R | G | R | G | R | G | R | G |
| G | B | G | B | G | B | G | B |
| G | B | G | B | G | B | G | B |
| R | G | R | G | R | G | R | G |
| R | G | R | G | R | G | R | G |

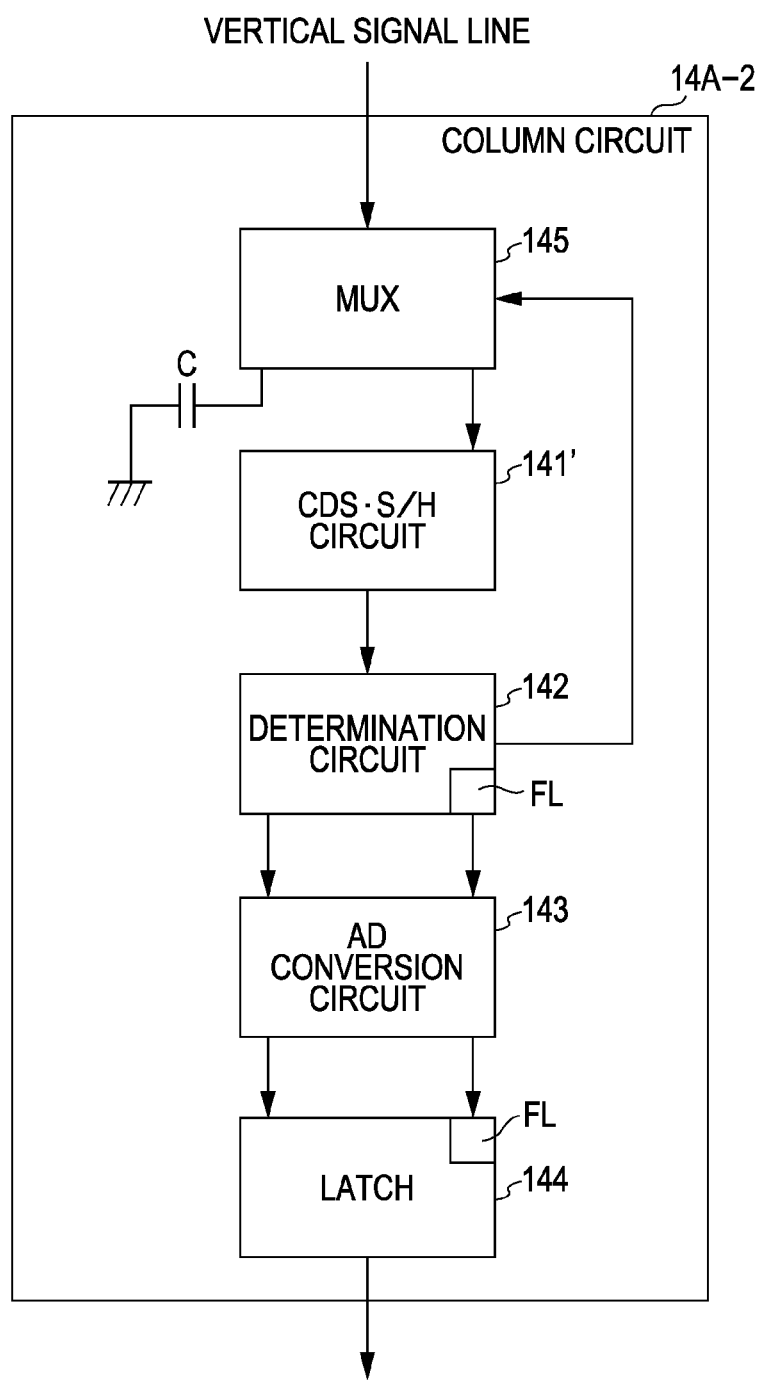

FIG. 14A

| READ-OUT OF THE i-TH ROW | READ-OUT OF THE i+1-TH ROW | READ-OUT OF THE i+2-TH ROW | AD CONVERSION 1 | AD CONVERSION 2 | (READ-OUT OF THE i+3-TH ROW) |

FIG. 14B

| READ-OUT OF THE i-TH ROW | READ-OUT OF THE i+1-TH ROW | READ-OUT OF THE i+2-TH ROW | AD CONVERSION 1 | AD CONVERSION 2 |

(READ-OUT OF THE i+3-TH ROW) (READ-OUT OF THE i+4-TH ROW) (READ-OUT OF THE i+5-TH ROW) (AD CONVERSION 1)

SOLID-STATE IMAGING DEVICE, SIGNAL PROCESSING METHOD OF SOLID-STATE IMAGING DEVICE, AND ELECTRONIC APPARATUS

CROSS-REFERENCE TO RELATED APPLICATIONS

This application is a continuation of U.S. patent application Ser. No. 14/845,738, filed Sep. 4, 2015, which is a continuation of U.S. patent application Ser. No. 14/508,327 filed Oct. 7, 2014, now U.S. Pat. No. 9,185,318, which is a continuation of U.S. patent application Ser. No. 14/052,316, filed Oct. 11, 2013, now U.S. Pat. No. 8,878,959, which is a division of U.S. patent application Ser. No. 12/731,402, filed Mar. 25, 2010, now U.S. Pat. No. 8,576,299, which claims priority to Japanese Patent Application Serial No. JP 2009-092854, filed in the Japan Patent Office on Apr. 7, 2009, the entire disclosures of which are hereby incorporated herein by reference.

BACKGROUND OF THE INVENTION

1. Field of the Invention

The present invention relates to a solid-state imaging device, a signal processing method of a solid-state imaging device, and an electronic apparatus.

2. Description of the Related Art

In a solid-state imaging device, such as a CCD (Charge Coupled Device) image sensor and a CMOS (Complementary Metal-Oxide Semiconductor) image sensor, unit pixels are in many cases arranged in a grid-like pattern at a predetermined pitch in the vertical and horizontal directions (see Japanese Unexamined Patent Application Publication No. 2007-189085, for example).

A pixel array having the same pitch in the vertical and horizontal directions is easily signal-processed, and thus has become a mainstream these days. Pixels arranged at the same pitch in the vertical and horizontal directions, i.e., pixels each having the same size in the vertical and horizontal directions are called square pixels. Meanwhile, pixels arranged at different pitches in the vertical and horizontal directions, i.e., pixels each having different sizes in the vertical and horizontal directions are called rectangular pixels.

In a solid-state imaging device used in an old type video camera or the like, rectangular pixels longer in the vertical size than in the horizontal size are used in many cases. This is because, in television broadcasting standards, the number of scanning lines running in the vertical direction is specified, but there is a degree of freedom in the number of scanning lines running in the horizontal direction, and therefore the advantage of using square grid pixels is minor if the intended purpose is to display an image on a television.

Meanwhile, for the purposes of performing image processing by using a personal computer and performing real-time extraction and recognition of a characteristic of an image by using machine vision, the square pixels are preferable to the rectangular pixels. In view of this, this type of solid-state imaging device, i.e., a solid-state imaging device using the square pixels has been increasingly used in video cameras.

Further, to provide a solid-state imaging device with a new function or an improved characteristic, a method of performing calculation between pixels mutually adjacent in the vertical or horizontal direction (hereinafter described as "adjacent pixels") is employed in some cases. For example, there has been a method of using different accumulation times for the pixels of even rows and the pixels of odd rows as a method of increasing the dynamic range (see Japanese Unexamined Patent Application Publication No. 11-150687, for example).

According to this method of increasing the dynamic range, however, if the dynamic range is increased on the basis of one image, the resolution in the vertical direction is reduced by half. In Japanese Unexamined Patent Application Publication No. 11-150687, two images are used to compensate for the resolution in the vertical direction. Instead, however, the dynamic resolution is deteriorated due to time lag. If calculation is thus performed between adjacent pixels in the vertical or horizontal direction, the resolution in the direction is changed. Consequently, a resultant output becomes equal to the output from the rectangular pixels.

SUMMARY OF THE INVENTION

Recently, it has become common to use a small pixel pitch of 2 µm or less in a pixel array. The pixel pitch of 2 µm or less is less than the resolution of a lens (an optical system) of a camera. In accordance with the extension of general thinking, the miniaturization of pixels is supposed to reduce the pixel sensitivity and the signal amount to be handled, but to increase the resolution. If the pixel pitch becomes less than the resolution of a lens, however, the resolution is not increased. That is, the resolution of a lens defines the limit of the resolution of a solid-state imaging device.

An example of the resolution of a lens is illustrated in FIG. 27. That is, if the aperture is opened (the F value is reduced), the aberration of the lens is increased, and thus the resolution is reduced. Further, if the aperture is closed (the F value is increased), diffraction is caused by the wave nature of light, and thus the resolution is reduced also in this case. The limit due to the wave nature is called the Rayleigh limit.

FIG. 27 illustrates an example of a lens in which the resolution is the highest at approximately F4 (F value=4). Even at F4, it is difficult to resolve the pixel pitch of 2 µm or less. In a single-lens reflex camera lens, the resolution is the highest at approximately F8, and thus the F value is set to be approximately F8 in many cases. In the single-lens reflex camera lens, when the F value is approximately F8 or less, the limit due to the aberration of the lens exceeds the limit due to the wave nature. Therefore, it is difficult to resolve a pixel pitch of 5 µm or less. Further, if a lens system includes an optical low-pass filter, the resolution of the optical system corresponds to the lower one of the resolution of the lens and the resolution of the optical low-pass filter.

In the present example, the size of each of the pixels is defined by the size of a photoelectric conversion element. Therefore, the pixel pitch refers to the pitch of the photoelectric conversion element. If incident light is sampled at spatially equal intervals in the vertical and horizontal directions, the pixels are square. If incident light is sampled at spatially different intervals in the vertical and horizontal directions, the pixels are rectangular. Therefore, the layout shape of the pixels may not necessarily be a square or rectangular shape, but may be a complicated shape such as the shape of jigsaw puzzle pieces, for example.

In the present invention, it is desirable to provide a solid-state imaging device, a signal processing method of a solid-state imaging device, and an electronic apparatus which perform calculation between adjacent pixels to provide an improved characteristic or a new function, to thereby achieve substantially the manageability of a square-pixel product and make image processing and system construction easier.

In the present invention, it is also desirable to provide a solid-state imaging device, a signal processing method of a solid-state imaging device, and an electronic apparatus which are capable of improving the imaging characteristic, even if pixels are miniaturized beyond the limit of the resolution.

In view of the above, a solid-state imaging device according to an embodiment of the present invention includes a pixel array section configured to include a plurality of arranged rectangular pixels, each of which has different sizes in the vertical and horizontal directions, and a plurality of adjacent ones of which are combined to form a square pixel having the same size in the vertical and horizontal directions. In the solid-state imaging device, signals are read out from the combined plurality of rectangular pixels, and the plurality of signals read out from the plurality of rectangular pixels are processed and output as a single signal.

The plurality of rectangular pixels are combined to form a square pixel, and the plurality of signals read out from the plurality of rectangular pixels are output as a single signal. Thereby, the single signal can be handled as the signal from a square grid (a square pixel). If incident light is sampled at spatially equal intervals in the vertical and horizontal directions, it is possible to make the plurality of rectangular pixels look like a square grid. With the single signal handled as the signal from a square grid, it is unnecessary to change the configuration of a signal processing system for square grids at a subsequent stage. Further, if the single signal is selected as appropriate from or synthesized from the respective signals of the plurality of rectangular pixels, it is possible to perform a process of improving the imaging characteristic, such as a process of increasing the dynamic range by using the single signal in the signal processing system at the subsequent stage. As a result, even if the pixels are miniaturized beyond the limit of the resolution, it is possible to improve the imaging characteristic while realizing the miniaturization of the pixels.

According to the embodiment of the present invention, calculation is performed between adjacent pixels in the vertical or horizontal direction to provide an improved characteristic or a new function. Thereby, it is possible to achieve substantially the manageability of a square-pixel product, and to make image processing and system construction easier. It is also possible to improve the imaging characteristic, even if the pixels are miniaturized beyond the limit of the resolution, and if the pixel pitch becomes less than the resolution of an optical system which receives incident light.

BRIEF DESCRIPTION OF THE DRAWINGS

FIG. 9 is a block diagram illustrating a configuration example of a column circuit according to a first specific example of the second modified example;

FIGS. 14A and 14B are timing charts each illustrating a temporal order of operations of the column circuit according to the third specific example of the second modified example;

DESCRIPTION OF THE PREFERRED EMBODIMENTS

Embodiments for implementing the invention (hereinafter described as "embodiments") will be described in detail below with reference to the drawings. The description will be made in the following order: 1. Solid-State Imaging Device according to Embodiment of Present Invention (Example of CMOS Image Sensor), 2. Characteristic Feature of Present Embodiment, 3. Modified Examples, and 4. Electronic Apparatus (Example of Imaging Apparatus).

1. SOLID-STATE IMAGING DEVICE ACCORDING TO EMBODIMENT OF PRESENT INVENTION

Figure 1:
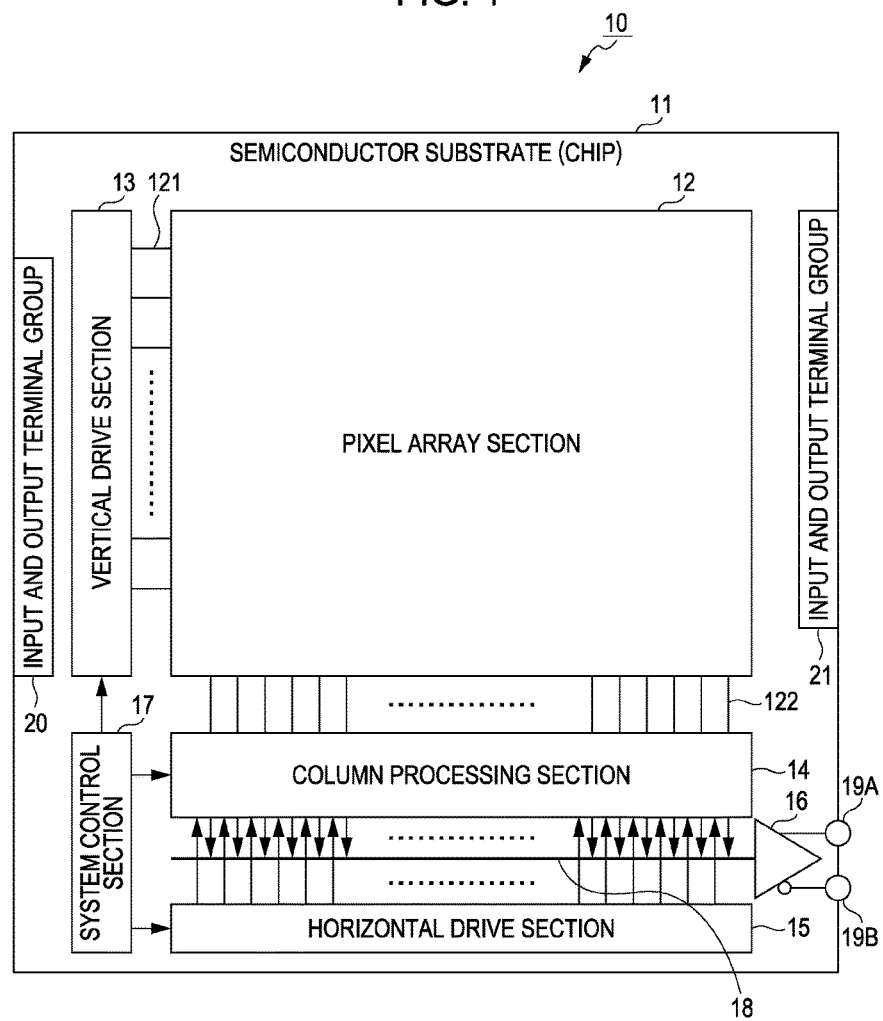
FIG. 1 is a system configuration diagram illustrating an overview of a system configuration of a CMOS image sensor according to an embodiment of the present invention.

FIG. 1 is a system configuration diagram illustrating an overview of a system configuration of a solid-state imaging device, e.g., a CMOS image sensor as a kind of X-Y address type solid-state imaging device, according to an embodiment of the present invention. Herein, the CMOS image sensor refers to an image sensor formed by application or partial use of a CMOS process.

As illustrated in FIG. 1, a CMOS image sensor 10 according to the present embodiment is configured to include a pixel array section 12 formed on a semiconductor substrate (hereinafter occasionally described as "chip") 11, and a peripheral circuit portion integrated on the same chip 11, on which the pixel array section 12 is formed. In the present example, the peripheral circuit portion includes a vertical drive section 13, a column processing section 14, a horizontal drive section 15, an output circuit section 16, and a system control section 17, for example.

In the pixel array section 12, unit pixels each including a photoelectric conversion element which generates and accumulates therein charges generated by photoelectric conversion (hereinafter simply described as the "charges") and having a charge amount according to the incident light amount (hereinafter occasionally described simply as the "pixels") are two-dimensionally arranged in rows and columns. A specific configuration of the unit pixel will be described later.

Further, in the pixel array section 12, pixel drive lines 121 are provided for the respective rows of the pixel array having rows and columns, to extend in the horizontal direction, i.e., the row direction (the direction in which the pixels are arrayed in the pixel rows). Further, vertical signal lines 122 are provided for the respective columns to extend in the vertical direction, i.e., the column direction (the direction in which the pixels are arrayed in the pixel columns). The number of the pixel drive lines 121 is one per every row in FIG. 1, but is not limited thereto. One end of each of the pixel drive lines 121 is connected to an output terminal of a corresponding row of the vertical drive section 13.

The vertical drive section 13 is configured to include a shift register, an address decoder, and so forth, and serves as a pixel drive section which drives the respective pixels of the pixel array section 12 simultaneously or in units of rows, for example. The vertical drive section 13, a specific configuration of which is not illustrated herein, is generally configured to include two scanning systems, i.e., a read-out (from photoelectric conversion element to output circuit) scanning system (hereinafter simply described as the "read-out scanning system") and a reset scanning system.

The read-out scanning system sequentially selects and scans the unit pixels of the pixel array section 12 in units of rows to read out the signals from the unit pixels. The signals read out from the unit pixels are analog signals. The reset scanning system performs reset scanning on read-out rows to be subjected to the read-out scanning by the read-out scanning system such that the reset scanning precedes the read-out scanning by a time corresponding to the shutter speed.

With the reset scanning by the reset scanning system, unnecessary charges are swept out from the photoelectric conversion elements of the unit pixels in the read-out rows. Thereby, the photoelectric conversion elements are reset. Then, with the resetting of the unnecessary charges by the reset scanning system, a so-called electronic shutter operation is performed. Herein, the electronic shutter operation refers to an operation of removing the charges of the photoelectric conversion elements and newly starting an exposure process (starting the accumulation of charges).

A signal read out through the read-out operation by the read-out scanning system corresponds to the amount of light incident after the immediately preceding read-out operation or the electronic shutter operation. The time period from the read-out timing of the immediately preceding read-out operation or the reset timing of the electronic shutter operation to the read-out timing of the present read-out operation corresponds to the accumulation period of the charges in a unit pixel (the exposure period).

The signals output from the respective unit pixels of the pixel rows selected and scanned by the vertical drive section 13 are supplied to the column processing section 14 through the respective vertical signal lines 122. The column processing section 14 performs, in units of pixel columns of the pixel array section 12, predetermined signal processing on the signals output from the respective unit pixels of the selected rows through the vertical signal lines 122, and temporarily holds the signal-processed pixel signals.

Specifically, upon receipt of the signals from the respective unit pixels, the column processing section 14 performs on the signals signal processing such as denoising based on CDS (Correlated Double Sampling), signal amplification, and AD (Analog-to-Digital) conversion, for example. The denoising process removes fixed pattern noise unique to pixels, such as reset noise and threshold variation among amplifier transistors. The signal processing exemplified herein is merely an example. Thus, the signal processing is not limited thereto.

The horizontal drive section 15 is configured to include a shift register, an address decoder, and so forth, and sequentially selects unit circuits corresponding to the pixel columns from the column processing section 14. Due to the selection and scanning by the horizontal drive section 15, the pixel signals signal-processed by the column processing section 14 are sequentially output to a horizontal bus 18 and transmitted to the output circuit section 16 by the horizontal bus 18.

The output circuit section 16 processes and outputs the signals transmitted by the horizontal bus 18. The processing by the output circuit section 16 may be only buffering, or may be a variety of digital signal processing such as prebuffering adjustment of the black level and correction of variation among the columns.

The output circuit section 16 has, for example, a differential output configuration, an output stage of which outputs a differential signal. That is, the output stage of the output circuit section 16 processes each of the signals transmitted by the horizontal bus 18, and outputs a resultant signal as a normal-phase signal. Further, the output stage of the output circuit section 16 reverses the polarity of the signal, and outputs a resultant signal as a reverse-phase signal.

The normal-phase signal is output to the outside of the chip 11 via a normal-phase output terminal 19A, and the reverse-phase signal is output to the outside of the chip 11 via a reverse-phase output terminal 19B. When the output stage of the output circuit section 16 has a differential output configuration, a signal processing section provided outside the chip 11, e.g., a signal processing IC (Integrated Circuit), receives the normal-phase signal and the reverse-phase signal at an input stage thereof, which is configured to be a differential circuit.

With the differential output configuration of the output stage of the output circuit section 16 and the differential circuit configuration of the input stage of the signal processing IC as described above, information can be transmitted by current between the output stage of the output circuit section 16 and the input stage of the signal processing IC. Therefore, even if the length of a transmission path between the output stage of the output circuit section 16 and the input stage of the signal processing IC is increased, charging and discharging do not occur on the transmission path. Accordingly, a high-speed system can be provided.

The system control section 17 receives, for example, a clock and operation mode specifying data supplied from outside the chip 11, and outputs data such as internal information of the CMOS image sensor 10. Further, the system control section 17 includes a timing generator for generating a variety of timing signals. On the basis of the variety of timing signals generated by the timing generator, the system control section 17 performs drive control of the peripheral circuit portion including the vertical drive section 13, the column processing section 14, the horizontal drive section 15, and so forth.

A peripheral portion of the chip 11 is provided with respective terminals of input and output terminal groups 20 and 21, which include power supply terminals. The input and output terminal groups 20 and 21 exchange power supply voltages and signals between the inside and the outside of the chip 11. The installation position of the input and output terminal groups 20 and 21 is determined at a convenient position in consideration of, for example, the incoming and outgoing directions of the signals with respect to the chip 11.

2. CHARACTERISTIC FEATURE OF PRESENT EMBODIMENT

In the CMOS image sensor 10 of the above-described configuration, a characteristic feature of the present embodiment lies in that the aspect ratio of each of the unit pixels is set to be other than 1:1 (a square pixel), i.e., the shape of the unit pixel is set to be a rectangle having different sizes in the vertical and horizontal directions (a rectangular pixel), that a plurality of adjacent ones of the unit pixels are combined to form a square pixel having the same size in the vertical and horizontal directions, and that the combined plurality of unit pixels output a single signal.

With this configuration, the single signal output from the unit of a plurality of pixels can be handled as the signal from a square pixel (a square grid). If incident light is sampled at spatially equal intervals in the vertical and horizontal directions, it is possible to make the pixels look like a square grid. With the single signal handled as the signal from a square grid, it is unnecessary to change the configuration of a commonly used signal processing system for square grids at a subsequent stage.

Further, if the single signal is selected as appropriate or synthesized from the respective signals of the plurality of pixels, it is possible to perform a process of improving the imaging characteristic, such as a process of increasing the dynamic range by using the single signal in the signal processing system at the subsequent stage. Specific embodiments will be described below.

First Embodiment

Figures 2, 3:
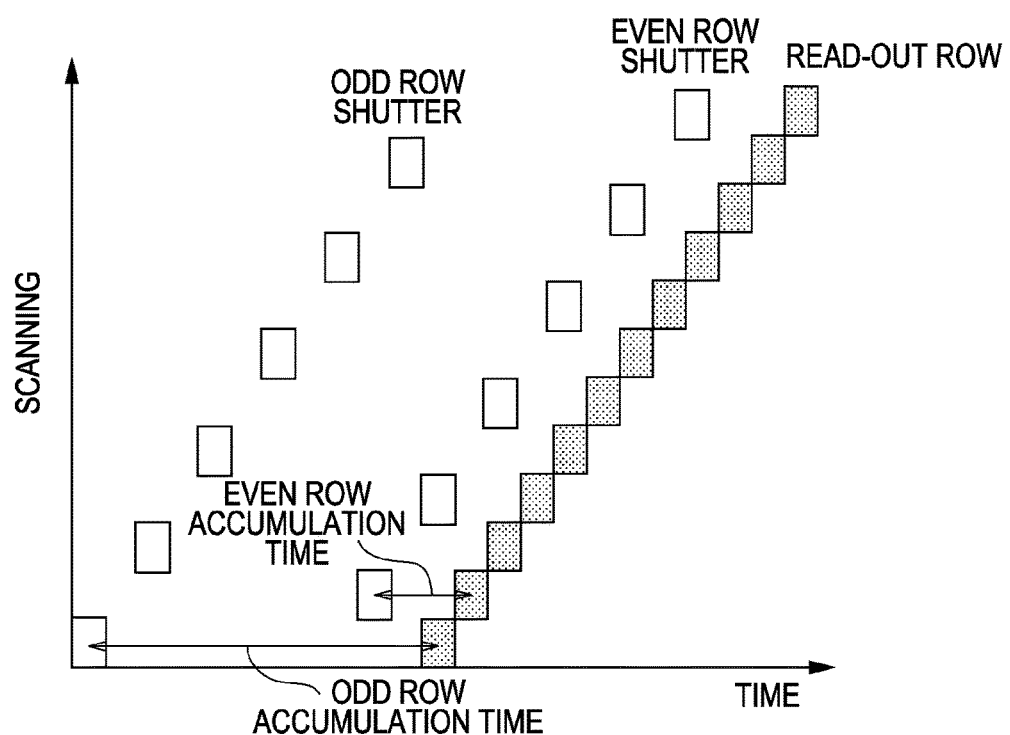
FIG. 2 is a configuration diagram illustrating an example of a pixel array in a pixel array section according to a first embodiment.
FIG. 3 is a conceptual diagram illustrating the procedure of a scanning method performed on the pixel array in the pixel array section according to the first embodiment.

FIG. 2 is a configuration diagram illustrating an example of the pixel array in the pixel array section 12 according to a first embodiment. As illustrated in FIG. 2, the pixel array section 12 includes unit pixels 30 each including a photoelectric conversion element and two-dimensionally arranged in multiple rows and columns. Herein, each of the unit pixels 30 is a so-called horizontally long rectangular pixel, which is twice as long in the horizontal size (in the row direction) as in the vertical size (in the column direction), i.e., which has a vertical-to-horizontal pitch ratio of 1:2.

If the CMOS image sensor 10 according to the present embodiment is capable of picking up a color image, color filters, e.g., on-chip color filters 40, are provided on respective light receiving surfaces of the unit pixels 30. Herein, a plurality, e.g., two of the unit pixels 30 adjacent in the vertical direction form a set. The set of two upper and lower pixels is provided with an on-chip color filter 40 of the same color.

The on-chip color filters 40 are arranged such that respective colors of R (red), G (green), and B (blue), for example, have a predetermined relationship. For example, color coding is designed herein such that two rows of color arrays of repeated GB combinations and two rows of color arrays of repeated RG combinations alternate. The two upper and lower pixels are the same in color. Therefore, one color filter can cover the two upper and lower pixels.

In the pixel array of the pixel array section 12, each of the unit pixels 30 is a horizontally long rectangular pixel having the vertical-to-horizontal size ratio of 1:2. As illustrated in FIG. 2, therefore, the shape of the individual on-chip color filter 40 for a set of two upper and lower pixels is square. The square on-chip color filters 40 are provided to the pixel array in which two rows of color arrays of repeated GB combinations and two rows of color arrays of repeated RG combinations alternate. Therefore, the overall color array of the on-chip color filters 40 is a so-called Bayer array.

With the on-chip color filters 40 configured to have the color array based on the units of two pixels, the following advantage is obtained. That is, along with the miniaturization of the CMOS process, pixels have been increasingly miniaturized. However, it has become increasingly difficult to miniaturize a color filter in accordance with the miniaturization of pixels. This is because it is difficult to miniaturize a color filter while preventing rounding and peeling-off of corners thereof and at the same time maintaining the spectroscopic characteristic thereof.

The on-chip color filter 40 of the above-described configuration example, however, can be formed into the size of two pixels combined, and thus is advantageous in terms of the miniaturization of pixels. That is, as described above, if a color filter is provided to each pixel, it is difficult to miniaturize the color filter in accordance with the miniaturization of the pixel. The present example, however, provides a color filter to a plurality of pixels, and thus can cope with the miniaturization of pixels.

(Scanning Method)

With reference to FIG. 3, description will now be made of a scanning method performed on the pixel array of the pixel array section 12 according to the first embodiment, i.e., the pixel array in which two rows of color arrays of repeated GB combinations and two rows of color arrays of repeated RG combinations alternate. The scanning is performed under the driving operation by the vertical drive section 13 of FIG. 1. The scanning method described with reference to FIG. 3 is a commonly used scanning method.

Firstly, shutter scanning is performed on the odd rows and then on the even rows. Then, scanning is performed on the read-out rows. Herein, the shutter scanning corresponds to the scanning called the electronic shutter operation described earlier, and defines the start of pixel accumulation. In the shutter scanning, different shutter timings are set for the respective pixels of the odd rows and the respective pixels of the even rows.

Specifically, as illustrated in FIG. 3, the shutter timing for the respective pixels of the odd rows is set to increase the accumulation time, while the shutter timing for the respective pixels of the even rows is set to reduce the accumulation time. That is, when two adjacent rows form a unit (a set), the accumulation time is set to be relatively long for the respective pixels of one of the rows (an odd row in the present example) and relatively short for the respective pixels of the other row (an even row in the present example).

Due to the above-described shutter scanning, the signal from each of the pixels in the odd rows accumulated for a long time is a high-sensitivity signal corresponding to the long accumulation time. That is, light is incident over a long time to each of the pixels in the odd rows. Therefore, the signal from each of the pixels in the odd rows is capable of capturing a clear image of a dark area. However, in each of the pixels in the odd rows, i.e., the high-sensitivity pixels, the photoelectric conversion element is saturated soon. Meanwhile, the signal from each of the pixels in the even rows accumulated for a short time is a low-sensitivity signal corresponding to the short accumulation time. That is, the amount of light incident to each of the pixels in the even rows is small. Therefore, the signal from each of the pixels in the even rows is capable of capturing an image of a light area without being saturated.

(Column Processing Section)

Subsequently, description will be made of the column processing section 14 which processes the signals output from the respective pixels 30 of the pixel array section 12 according to the first embodiment on the basis of the scanning performed by the above-described scanning method. The column processing section 14 is a collection of unit circuits provided to correspond to the pixel columns of the pixel array section 12. Hereinafter, each of the unit circuits constituting the column processing section 14 will be referred to as the column circuit.

Figure 4:
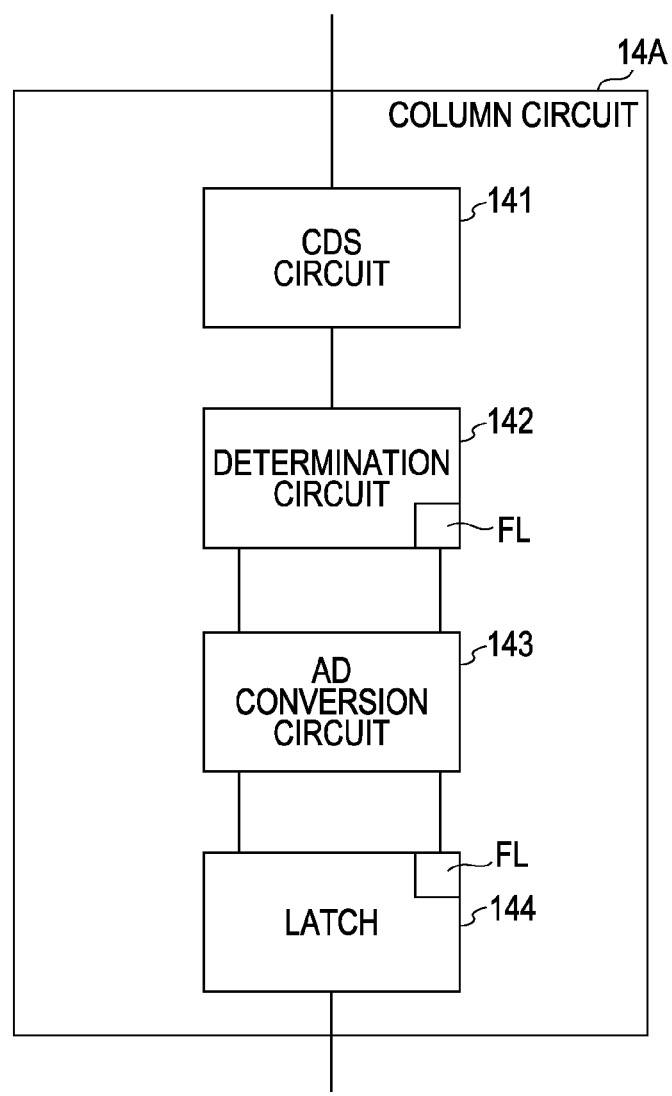
FIG. 4 is a block diagram illustrating an example of the configuration of a column circuit according to the first embodiment.

FIG. 4 is a block diagram illustrating an example of the configuration of a column circuit 14A according to the first embodiment. As illustrated in FIG. 4, the column circuit 14A according to the first embodiment is configured to include a CDS circuit 141, a determination circuit 142, an AD conversion circuit 143 for performing predetermined signal processing such as an AD conversion process, for example, and a latch 144.

Under the driving operation by the vertical drive section 13, the signals of the pixels are sequentially supplied from the pixel array section 12 to the column circuit 14A in descending order of sensitivity of the pixels. In the present example, a pixel of an odd row is higher in sensitivity than a pixel of an even row. Therefore, the signal from the pixel of the odd row is first input to the column circuit 14A, and the signal from the pixel of the even row is then input to the column circuit 14A.

As widely known, the CDS circuit 141 of the column circuit 14A performs signal processing for calculating the difference between the ON level (a later-described signal level) and the OFF level (a later-described reset level) of a pixel signal and calculating a signal amount excluding the offset.

Under the control of the system control section 17, the determination circuit 142 performs, in read-out of each of the signal from a high-sensitivity pixel and the signal from a low-sensitivity pixel sequentially read out from the pixel array section 12, a process of determining whether or not the signal is equal to or more than a predetermined value. The saturation level of the pixels, for example, is used as the predetermined value representing a determination standard of the determination circuit 142.

The determination circuit 142, the AD conversion circuit 143, and the latch 144 perform the following different processing operations on the signal from the pixel of the odd row and the signal from the pixel of the even row.

[Odd Row]

Using the saturation level of the pixels as the determination standard, the determination circuit 142 determines whether or not the signal transmitted from the pixel of the odd row has not been saturated. If the signal is not at the saturation level, the determination circuit 142 writes a logic "0" into a flag FL. If the signal is at the saturation level, the determination circuit 142 writes a logic "1" into the flag FL. Then, the determination circuit 142 sends the flag FL to the AD conversion circuit 143 together with the signal received from the CDS circuit 141.

If the flag FL stores the logic "0" (i.e., the signal is not at the saturation level), the AD conversion circuit 143 operates to perform AD conversion on the signal (an analog signal) from the pixel and pass the AD-converted signal to the latch 144. If the flag FL stores the logic "1" (i.e., the signal is at the saturation level), the AD conversion circuit 143 is placed in a standby state, and thus does not perform the AD conversion process. The value of the flag FL is written into a part of the latch 144 via the AD conversion circuit 143.

[Even Row]

The determination circuit 142 does not perform the determination process on the signal transmitted from the pixel of the even row, and sends the signal to the AD conversion circuit 143 together with the determination result of the signal from the pixel of the odd row, i.e., the value of the flag FL. Upon receipt from the determination circuit 142 of the signal from the pixel of the even row together with the value of the flag FL, the AD conversion circuit 143 operates, only when the flag FL stores the logic "1," to perform the AD conversion on the signal from the pixel of the even row and pass the AD-converted signal to the latch 144.

Specifically, if the flag FL received from the determination circuit 142 stores the logic "0," i.e., if the signal from the pixel of the odd row is not at the saturation level, the AD conversion circuit 143 is placed in the standby state and does not perform the AD conversion process on the signal from the pixel of the even row. Further, if the flag FL stores the logic "1," i.e., if the signal from the pixel of the odd row is at the saturation level, the AD conversion circuit 143 performs the AD conversion process on the signal from the pixel of the even row.

In the above-described manner, the signals from the pixels of two rows (i.e., the two upper and lower pixels) are processed by the column circuit 14A in the order of the odd row and the even row. Thereafter, the value of the resultant pixel signal and the value of the flag FL are read out from the latch 144 to the horizontal bus 18 illustrated in FIG. 1. As a result, the signal of either one of the two upper and lower pixels is AD-converted and output. In this process, the signal of the other pixel is not subjected to the AD conversion process, with the AD conversion circuit 143 placed in the standby state. The two upper and lower pixels share the previously described filter of the same color.

If the signal from the high-sensitivity pixel accumulated for the long time has been saturated, the signal from the low-sensitivity pixel accumulated for the short time is used. Herein, the saturation refers to the state wherein a signal is mainly at a level at which the signal does not respond substantially linearly to the amount of incident light. In the present example, if the high-sensitivity signal read out from the pixel of the odd row has not been saturated, the signal level of the high-sensitivity signal and the value "0" of the flag FL are output from the column circuit 14A to the horizontal bus 18. If the signal read out from the pixel of the odd row has been saturated, the signal level of the low-sensitivity signal read out from the pixel of the even row and the value "1" of the flag FL are output from the column circuit 14A to the horizontal bus 18.

Figure 26:
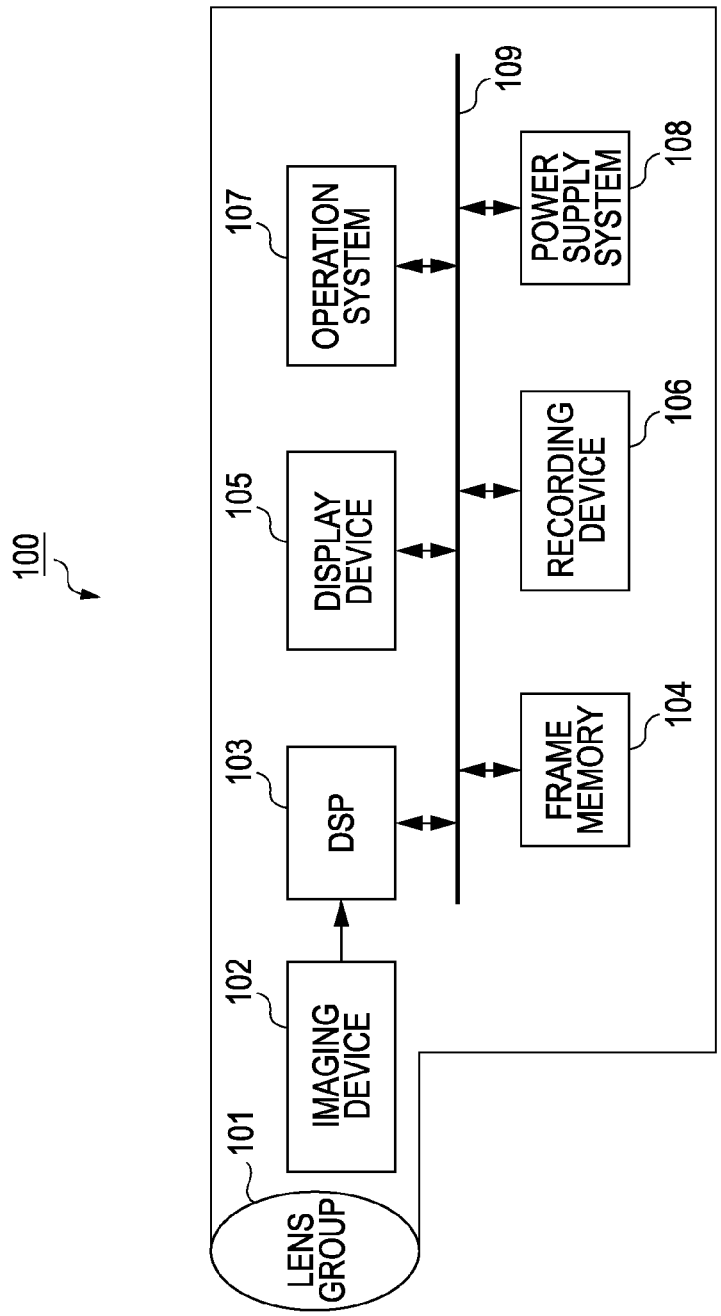
FIG. 26 is a block diagram illustrating a configuration example of an imaging apparatus as an example of an electronic apparatus according to an embodiment of the present invention.
Figure 27:
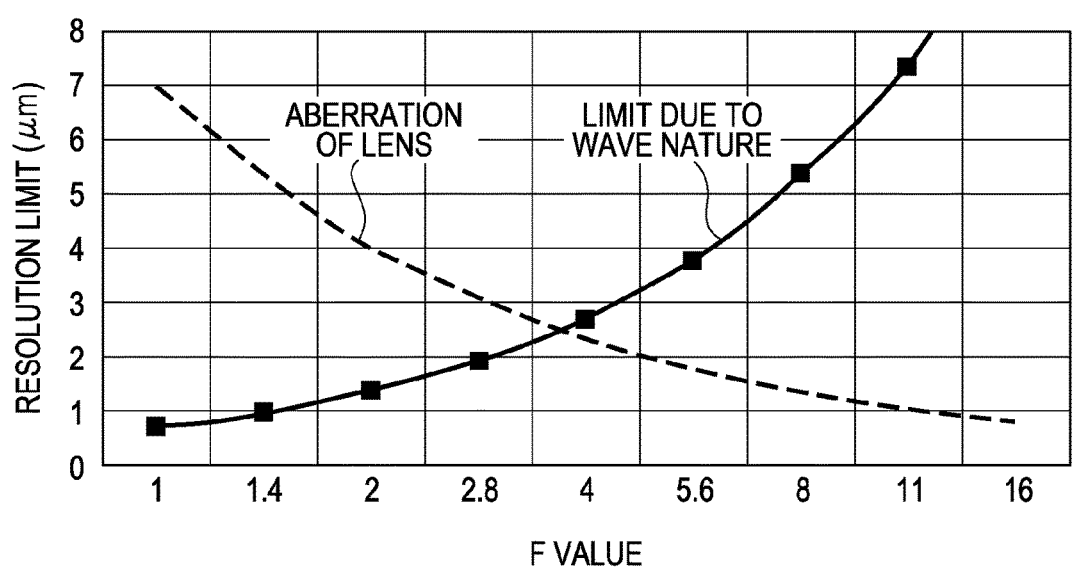
FIG. 27 is a diagram illustrating the relationship between the F value of a lens and the resolution limit.

Then, on the basis of the signal level and the value of the flag FL, a signal processing section at a subsequent stage, e.g., a DSP (Digital Signal Processor) 103 in FIG. 26, performs signal processing. Thereby, the dynamic range can be increased. Specifically, if the flag FL indicates that the signal from the high-sensitivity pixel has not been saturated (FL=0), the signal processing section at the subsequent stage generates a video signal by using the signal from the high-sensitivity pixel provided together with the flag FL as a pair.

If the flag FL indicates that the signal from the high-sensitivity pixel has been saturated (FL=1), the signal processing section at the subsequent stage generates a video signal by using the signal level of the signal from the low-sensitivity pixel provided together with the flag FL as a pair. With the above-described signal processing, the dynamic range with respect to the light input can be increased.

If the pitch of the two upper and lower pixels is practically equal to or less than the lens resolution, the vertical resolution is not reduced, and the signal from the two upper and lower pixels can be viewed as if a signal having an increased dynamic range is output from a square pixel. Herein, the lens resolution refers to the resolution of an image formed on an imaging surface of the CMOS image sensor 10 through a lens of an optical system which receives incident light.

Strictly speaking, there may be cases in which the resolution is determined by a component other than the lens, such as an optical low-pass filter. Further, if imaging performed without the use of a so-called "lens," such as direct imaging using X-ray or transmitted light, is taken into account, the lens resolution refers to the resolution of an optical system for forming an image on the imaging surface of the CMOS image sensor 10.

To make the signal from the two upper and lower pixels look like the signal output from a single pixel, it is desirable that the two upper and lower pixels are as similar to each other as possible in the offset and the sensitivity characteristic, and that the characteristic difference between the two upper and lower pixels is smaller than normal pixel variation. Otherwise, a gap may be caused in a transitional region between the signals of the two pixels. In view of this, the two upper and lower pixels share some of circuit elements constituting a pixel circuit. The sharing of some of the circuit elements by the pixels will be described later.

Meanwhile, as described previously, the column circuit 14A is configured such that the signal of either one of two pixels forming a set (the high-sensitivity pixel and the low-sensitivity signal in the present example) is subjected to the AD conversion, and that the signal of the other pixel is not subjected to the AD conversion, with the AD conversion circuit 143 placed in the standby state. This configuration has an advantage in that the power consumption can be reduced due to the standby state of the AD conversion circuit 143, as compared with the case in which the AD conversion process is performed on both of the respective signals of the two pixels.

The application of the signal processing technique described above is not limited to the CMOS image sensor 10 configured to form a square pixel by combining a plurality of rectangular pixels, and to output a plurality of signals read out from the plurality of rectangular pixels as a single signal to be handled as the signal of the square pixel. That is, irrespective of the shape of the unit pixels 30, the signal processing technique is applicable to CMOS image sensors in general, in which the unit pixels 30 are two-dimensionally arranged in rows and columns.

Further, in the present example, the case in which two pixels including a high-sensitivity pixel and a low-sensitivity pixel form a set has been described as an example. However, the number of pixels forming a set is not limited to two. Further, the signal processing performed on the signals of the pixels is not limited to the AD conversion process.

That is, when the n (2≤n) number of pixels (n=2 in the present example) form a set and the n number of signals are sequentially read out from the n number of pixels in the pixel array section 12, the determination circuit 142 determines, in read-out of each of the signals, whether or not the signal is equal to or more than a predetermined value. Then, on the basis of the result of the determination, predetermined signal processing is performed on the m number of signals, wherein m is less than n (1≤m<n). Accordingly, the power consumption can be reduced due to the absence of the predetermined signal processing on the (n-m) number of signals.

<<Column Processing Performed when n=3>>

Column processing according to a first modified example (signal processing by a column circuit 14A-1) will be described below with reference to an example in which the number n is other than two, such as three, for example, i.e., three pixels of mutually different sensitivities form a set.

Figure 5:
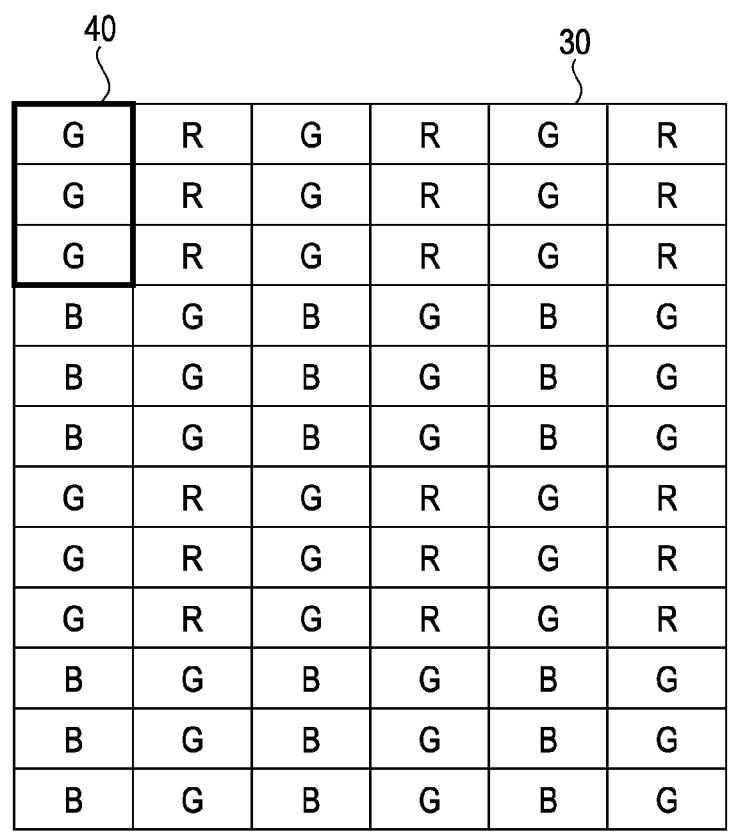
FIG. 5 is a configuration diagram illustrating an example of the pixel array in the pixel array section, wherein three pixels of different sensitivities form a set.

FIG. 5 illustrates an example of the pixel array of the pixel array section 12, in which three pixels of different sensitivities form a set. As illustrated in FIG. 5, in the present example, color coding is designed such that three rows of color arrays of repeated GR combinations and three rows of color arrays of repeated BG combinations alternate. Further, three pixels of the same color adjacent in the vertical direction form a set, and have a sensitivity level relationship in which the uppermost pixel of the three pixels has the highest sensitivity and the lowermost pixel of the three pixels has the lowest sensitivity, for example.

However, the sensitivity level relationship is not limited to this order. In any sensitivity level relationship, it is preferable that the signal from a high-sensitivity pixel is first read out and input to the column circuit 14A-1 according to the first modified example of the first embodiment under the driving operation by the vertical drive section 13.

Figure 6:
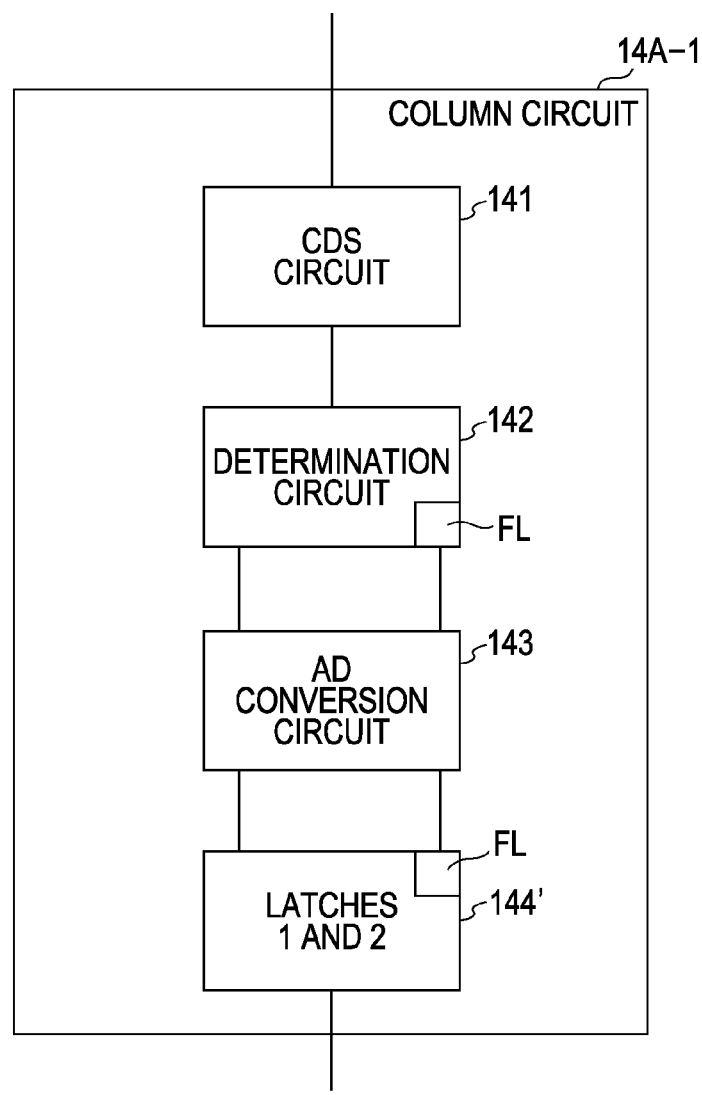
FIG. 6 is a block diagram illustrating a configuration example of a column circuit according to a first modified example of the first embodiment.

FIG. 6 illustrates a configuration example of the column circuit 14A-1 according to the first modified example of the first embodiment. The column circuit 14A-1 according to the present modified example is basically similar in configuration to the column circuit 14A according to the first embodiment illustrated in FIG. 4. The column circuit 14A-1 is different from the column circuit 14A in that a latch 144' is formed by two latches 1 and 2.

The determination circuit 142, the AD conversion circuit 143, and the latch 144' perform the following different processing operations on the signals from the respective pixels of the first, second, and third rows.

[First Row]

Using the saturation level of the pixels as the determination standard, the determination circuit 142 determines whether or not the signal transmitted from the pixel of the first row has not been saturated. If the signal is not at the saturation level, the determination circuit 142 writes a logic "0" into a flag FL. If the signal is at the saturation level, the determination circuit 142 writes a logic "1" into the flag FL. Then, the determination circuit 142 sends the flag FL to the AD conversion circuit 143 together with the signal received from the CDS circuit 141.

If the flag FL stores the logic "0" (i.e., the signal is not at the saturation level), the AD conversion circuit 143 operates to perform the AD conversion on the analog signal of the pixel and write the AD-converted signal into the latch 1 of the latch 144'. If the flag FL stores the logic "1" (i.e., the signal is at the saturation level), the AD conversion circuit 143 is placed in the standby state, and thus does not perform the AD conversion process. The value of the flag FL is written into a part of the latch 144' via the AD conversion circuit 143.

[Second Row]

The determination circuit 142 does not perform the determination process on the signal transmitted from the pixel of the second row, and sends the signal to the AD conversion circuit 143 together with the determination result of the signal from the pixel of the first row, i.e., the value of the flag FL. Upon receipt from the determination circuit 142 of the signal from the pixel of the second row together with the value of the flag FL, the AD conversion circuit 143 operates irrespective of the value of the flag FL to perform the AD conversion on the signal from the pixel of the second row. In this process, if the flag FL stores the logic "0," the AD conversion circuit 143 writes the AD conversion result into the latch 2 of the latch 144'. If the flag FL stores the logic "1," the latch 1 of the latch 144' is vacant, and thus the AD conversion circuit 143 writes the AD conversion result into the latch 1.

[Third Row]

The determination circuit 142 does not perform the determination process on the signal transmitted from the pixel of the third row, and sends the signal to the AD conversion circuit 143 together with the determination result of the signal from the pixel of the first row, i.e., the value of the flag FL. Upon receipt from the determination circuit 142 of the signal from the pixel of the third row together with the value of the flag FL, the AD conversion circuit 143 operates, only when the flag FL stores the logic "1," to perform the AD conversion on the signal from the pixel of the third row.

Specifically, if the flag FL received from the determination circuit 142 stores the logic "0," i.e., if the signal from the pixel of the first row is not at the saturation level, the AD conversion circuit 143 is placed in the standby state and does not perform the AD conversion process on the signal from the pixel of the third row. Further, if the flag FL stores the logic "1," i.e., if the signal from the pixel of the first row is at the saturation level, the AD conversion circuit 143 performs the AD conversion process on the signal from the pixel of the third row, and writes the AD conversion result into the latch 2 of the latch 144'.

The signals from the three pixels are processed in the above-described manner by the column circuit 14A-1. Thereafter, the value of the flag FL and the values of the signals in the two latches 1 and 2 of the latch 144' are read out to the horizontal bus 18 illustrated in FIG. 1. Due to the signal processing by the column circuit 14A-1, the signals of two pixels out of the three pixels are AD-converted and output.

More specifically, if the initially read out signal of the high-sensitivity pixel has been saturated, the signal of the high-sensitivity pixel is not subjected to the AD conversion process, and the AD conversion results of the signal of the intermediate-sensitivity pixel and the signal of the low-sensitivity pixel are written into the two latches 1 and 2 of the latch 144'. Meanwhile, if the initially read out signal of the high-sensitivity pixel has not been saturated, the signal of the high-sensitivity pixel and the signal of the intermediate-sensitivity pixel are subjected to the AD conversion, and the AD conversion results of the signals are written into the two latches 1 and 2 of the latch 144'. The signal of the low-sensitivity pixel is not subjected to the AD conversion process.

The values of the flag FL and the digital signals written in the two latches 1 and 2 of the latch 144' are output to the horizontal bus 18. Then, the signal processing section at the subsequent stage (e.g., the DSP 103 in FIG. 26) performs signal processing on the basis of the values of these signals and the flag FL. Thereby, the dynamic range can be increased.

In the above-described processing example, in which the signals of three pixels forming a set are sequentially read out, the AD conversion circuit 143 operates only twice and stands by once in accordance with the determination of the signal level made by the determination circuit 142. Accordingly, the present example can reduce the power consumption, as compared with the case in which the AD conversion circuit 143 operates three times for the respective signals of three pixels.

In the above, description has been made of the example in which the AD conversion is typically performed on two pixels out of three pixels. However, if the signal level of the signal from the pixel of the second row is also determined by the determination circuit 142, and if the signal from the pixel of the second row has also been saturated as well as the signal from the pixel of the first row, the AD conversion circuit 143 may also be placed in the standby state for the signal from the pixel of the second row. In this case, there arises a slight change, such as a change of the flag FL into two bits. However, such a change can be sufficiently predicted by a designer.

As described above, a variety of applications are possible depending on the concept of a designer. That is, the technical scope of the present invention is not limited to the scope described in the above-described embodiment. Therefore, the above-described embodiment can be modified or improved in various ways within the scope not departing from the gist of the invention, and such modified or improved embodiments are also included in the technical scope of the present invention. It is obvious to a person skilled in the art that the present invention is also applicable to the handling of the signals from four or more pixels of different sensitivities.

Figure 7A:
FIGS. 7A and 7B are timing charts each illustrating a temporal order of operations of the column circuit according to the first embodiment or the first modified example.
Figure 7B:
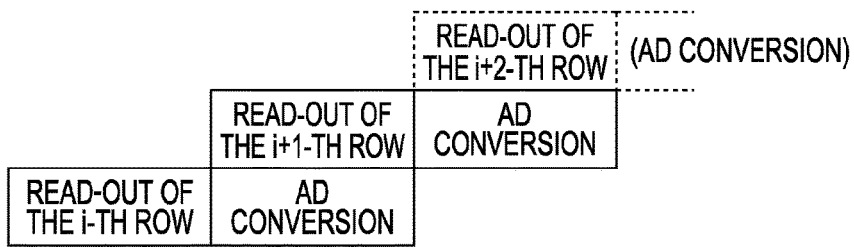

The above-described overview of the column processing performed when the number n is two or three will now be summarized with reference to FIGS. 7A and 7B each illustrating a temporal order of operations. FIGS. 7A and 7B illustrate two processing examples.

As illustrated in FIG. 7A, the signal is first read out from the pixel of the i-th row having the highest sensitivity. In response to this, the determination circuit 142 determines whether or not the signal read out from the pixel of the i-th row has been saturated. In this process, if the signal is determined to be unsaturated, the AD conversion process is performed on the signal from the pixel of the i-th row during the AD conversion period for the i-th row.

Meanwhile, if the signal is determined to be saturated, the AD conversion process is not performed on the signal during the AD conversion period for the i-th row, with the AD conversion circuit 143 placed in the standby state. In this process, the determination of whether or not the signal of a pixel has been saturated is made for each of the pixel columns. Therefore, the signal from the pixel of the i-th row may be from a pixel column subjected to the AD conversion process or from a pixel column not subjected to the AD conversion process.

Then, the signal is read out from the pixel of the i+1-th row lower in sensitivity than the pixel of the i-th row. In the AD conversion period for the i+1-th row, the signal from the pixel column subjected to the AD conversion process in the i-th row is not subjected to the AD conversion process, with the AD conversion circuit 143 placed in the standby state. Meanwhile, the signal from the pixel column not subjected to the AD conversion process in the i-th row is subjected to the AD conversion process.

As described above, in the column processing according to the first embodiment, for example, two AD conversion periods are provided for the read-out of the signals from the pixels of two rows. Further, the AD conversion circuit 143 operates in one of the two AD conversion periods. As illustrated in FIG. 7B, also in a processing example in which, during the AD conversion period for the signal from a pixel of a given row, the read-out of the signal from a pixel of the next row is performed in parallel, the AD conversion circuit 143 operates in one of the two AD conversion periods.

The operation of the AD conversion circuit 143 in one of the two AD conversion periods to perform the AD conversion process indicates that the AD conversion circuit 143 is placed in the standby state in the other AD conversion period. Accordingly, the power consumption can be reduced due to the standby state of the AD conversion circuit 143.

In the column processing according to the above-described first embodiment or first modified example (signal processing by the column circuit 14A or 14A-1), the AD conversion circuit 143 is not constantly kept in the operating state, but is placed in the standby state as appropriate to reduce the power consumption. Column processing achieving a reduction in signal processing time in addition to the reduction in power consumption will be described below as column processing according to a second modified example.

Figure 8A:
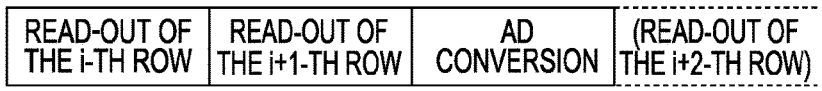
FIGS. 8A and 8B are timing charts each illustrating a temporal order of operations of a column circuit according to a second modified example of the first embodiment.
Figure 8B:
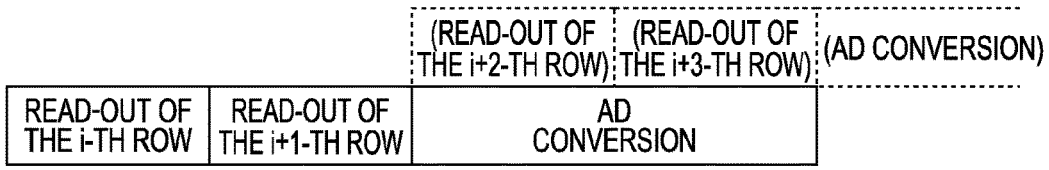

FIGS. 8A and 8B are timing charts each illustrating a temporal order of operations of a column circuit according to the second modified example. FIGS. 8A and 8B illustrate two processing examples. The column circuit according to the second modified example is assumed to include a sample/hold (S/H) circuit.

As illustrated in FIG. 8A, the signal is first read out from the pixel of the i-th row, which is an odd row, for example. In response to this, the determination circuit 142 determines whether or not the signal read out from the pixel of the i-th row has been saturated. If the signal from the pixel of the i-th row is determined to be unsaturated, the signal is held by the sample/hold circuit. In this process, the unsaturated signal does not necessarily have to be held by the sample/hold circuit.

Then, the signal is read out from the pixel of the i+1-th row, which is an even row. In this process, if the foregoing signal from the pixel of the i-th row has not been saturated, the signal from the pixel of the i+1-th row is blocked out from the sample/hold circuit. Conversely, if the signal from the pixel of the i-th row has been saturated, the signal from the pixel of the i+1-th row is held by the sample/hold circuit. Then, the processing proceeds to the AD conversion period, and the AD conversion circuit 143 performs the AD conversion process on the signal held by the sample/hold circuit.

As described above, when the number n is two, for example, in the column processing according to the second modified example, one AD conversion period is set for the read-out of the signals from the pixels of two rows. That is, the AD conversion periods can be reduced due to the absence of the standby period for the read-out of the signals from two rows. Therefore, the column processing of the present example can increase the signal processing speed, as compared with the column processing of the first embodiment or the first modified example, in which two AD conversion periods are set for the read-out of the signals from two rows.

Further, if the signal processing speed of the present example is allowed to be as low as the signal processing speed of the column processing of the first embodiment or the first modified example, the accuracy of the low-speed signal processing, e.g., the conversion accuracy of the AD conversion process, can be improved. Further, with one AD conversion period set for the read-out of the signals from two rows, the present example can achieve lower power consumption than in the case in which two AD conversion periods are set.

As illustrated in FIG. 8B, also in a processing example in which, during the AD conversion period for the signals from pixels of two rows, for example, the read-out of the signals from pixels of the next two rows is performed in parallel, only one AD conversion period can be set for the read-out of the signals from the pixels of two rows.

Description will be made below of a specific example of the column circuit 14A for implementing the column processing according the above-described second modified example.

FIG. 9 is a block diagram illustrating a configuration example of a column circuit 14A-2 according to a first specific example of the second modified example. In the drawing, components equivalent to the components of FIG. 4 are designated by the same reference numerals.

As illustrated in FIG. 9, the column circuit 14A-2 according to the first specific example is configured to include a multiplexer (MUX) 145, in addition to a CDS circuit 141' including a sample/hold circuit, the determination circuit 142, the AD conversion circuit 143, and the latch 144. Hereinafter, the CDS circuit 141' will be described as the CDS·S/H circuit 141'.

The multiplexer 145 selects, as appropriate, between the supply of the signal of a pixel input thereto through the corresponding vertical signal line 122 to the CDS·S/H circuit 141' and the discharge of the signal to the ground via a capacitance element C. The CDS·S/H circuit 141' is basically the same as the CDS circuit 141 of the first embodiment except that the CDS·S/H circuit 141' includes a sample/hold circuit. Further, the determination circuit 142, the AD conversion circuit 143, and the latch 144 are also basically the same as those of the first embodiment.

Subsequently, signal processing by the column circuit 14A-2 of the above configuration according to the first specific example will be described. At the arrival timing of the signal from the pixel of the i-th row, which is an odd row, for example, the determination circuit 142 controls the multiplexer 145 to supply the CDS·S/H circuit 141' with the signal from the pixel of the i-th row. Thereby, the signal from the pixel of the i-th row is subjected to CDS processing by the CDS·S/H circuit 141' and held by the sample/hold circuit.

The determination circuit 142 determines whether or not the signal from the pixel of the i-th row held by the CDS·S/H circuit 141' has been saturated. The determination circuit 142 then writes the determination result into the flag FL, and holds identification information identifying the signal from the pixel of the i-th row. In this process, if the signal is determined to be unsaturated, the determination circuit 142 switches the multiplexer 145 to the capacitance element C. Meanwhile, if the signal is determined to be saturated, the determination circuit 142 maintains the present state of the multiplexer 145 (connected to the CDS·S/H circuit 141').

Then, the signal is read out from the pixel of the i+1-th row, which is an even row. If the foregoing signal from the pixel of the i-th row has not been saturated, the multiplexer 145 has been switched to the capacitance element C. Therefore, the signal from the pixel of the i+1-th row is not input to the CDS·S/H circuit 141', and is discharged to the ground via the capacitance element C. Further, the CDS·S/H circuit 141' continues to hold the foregoing signal from the pixel of the i-th row. If the signal from the pixel of the i-th row has been saturated, the signal from the pixel of the i+1-th row is input to the CDS·S/H circuit 141' to be subjected to CDS processing, sampled, and held by the CDS·S/H circuit 141'.

Then, the processing proceeds to the AD conversion period. The AD conversion circuit 143 performs the AD conversion on the signal supplied by the CDS·S/H circuit 141', and passes the AD-converted signal to the latch 144. In this process, the AD conversion circuit 143 receives from the determination circuit 142 the identification information indicating whether the AD-converted signal is from an odd row or an even row, and passes the identification information to the latch 144. Further, the determination circuit 142 switches the multiplexer 145 to the CDS·S/H circuit 141'. Then, the signal processing is repeatedly performed in a similar manner on the signal from the pixel of the i+2-th row and the signals from the pixels of the subsequent rows.

With the sequence of signal processing described above, it is possible to obtain a signal, with which the previously described process of increasing the dynamic range can be performed. In the above-described signal processing, when the signal from the pixel of the i+1-th row is unnecessary, the switching of the multiplexer 145 to the capacitance element C is performed, instead of simple disconnection of the connection between the vertical signal line 122 and the CDS·S/H circuit 141', to prevent a substantial change in the capacity of the vertical signal line 122.

Figure 10:
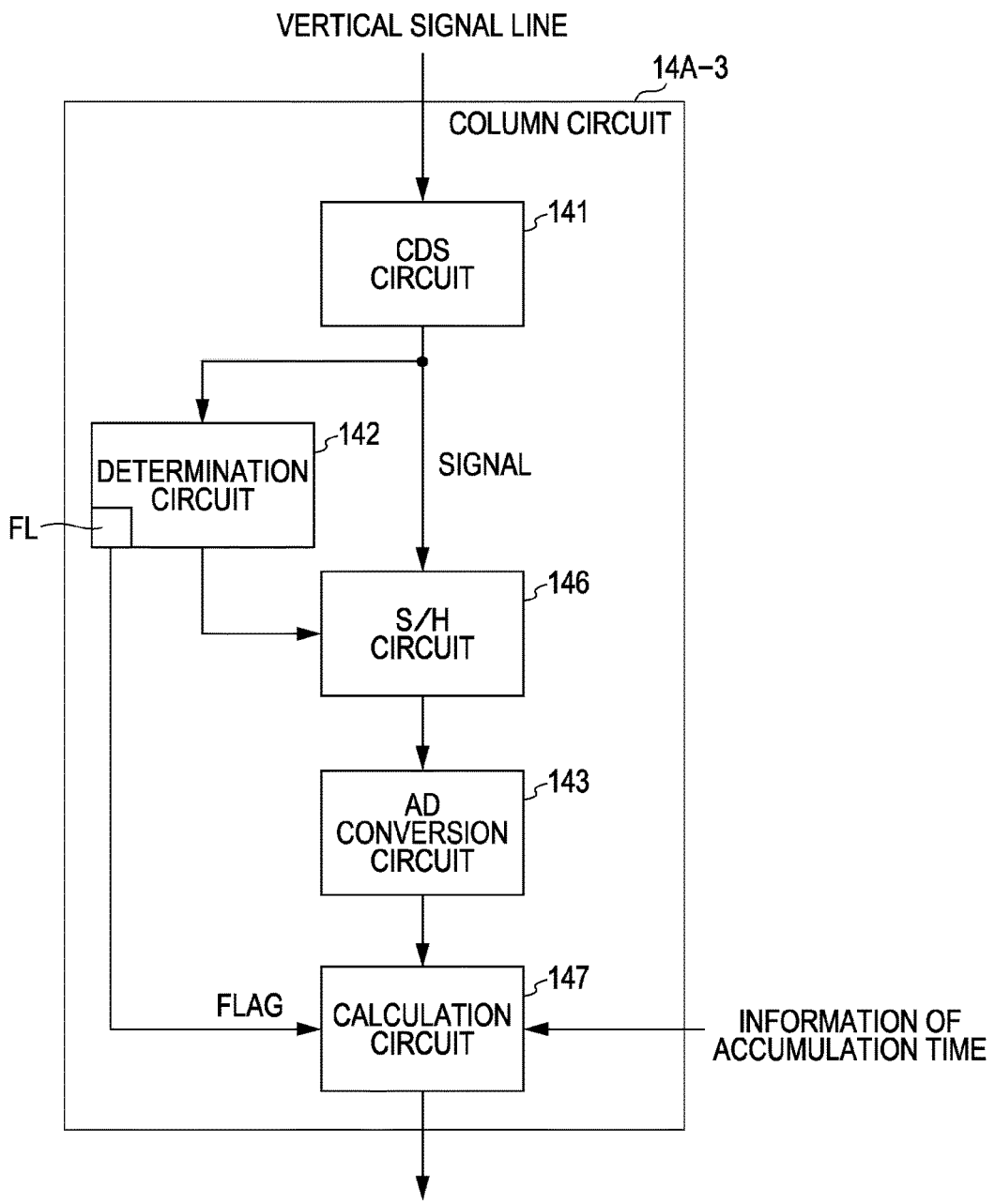
FIG. 10 is a block diagram illustrating a configuration example of a column circuit according to a second specific example of the second modified example.

FIG. 10 is a block diagram illustrating a configuration example of a column circuit 14A-3 according to a second specific example of the second modified example. In the drawing, components equivalent to the components of FIG. 4 are designated by the same reference numerals.

As illustrated in FIG. 10, the column circuit 14A-3 according to the second specific example is configured such that an S/H circuit 146 is provided between the CDS circuit 141 and the AD conversion circuit 143, that the determination circuit 142 is provided in parallel with the S/H circuit 146, and that a calculation circuit 147 is provided in place of the latch 144. The CDS circuit 141, the determination circuit 142, and the AD conversion circuit 143 are basically the same as those of the first embodiment. Details of the functions of the calculation circuit 147 will be described later.

Subsequently, signal processing by the column circuit 14A-3 of the above configuration according to the second specific example will be described. The signal from the pixel of the i-th row, which is an odd row, for example, is input to the CDS circuit 141 to be subjected to CDS processing by the CDS circuit 141. The determination circuit 142 determines whether or not the CDS-processed signal from the pixel of the i-th row has been saturated, and writes the determination result into the flag FL.

In this process, the determination circuit 142 also controls the S/H circuit 146. Specifically, if the signal from the pixel of the i-th row has not been saturated, the determination circuit 142 operates the S/H circuit 146 to hold the signal in the S/H circuit 146. If the signal from the pixel of the i-th row has been saturated, the determination circuit 142 may or may not operate the S/H circuit 146.

Thereafter, the signal is read out from the pixel of the i+1-th row, which is an even row, and is subjected to CDS processing by the CDS circuit 141. In this process, the determination circuit 142 refers to the flag FL. If the foregoing signal from the pixel of the i-th row has been saturated, the determination circuit 142 operates the S/H circuit 146 to hold therein the signal from the pixel of the i+1-th row. If the signal from the pixel of the i-th row has not been saturated, the determination circuit 142 does not operate the S/H circuit 146, and causes the S/H circuit 146 to continue to hold the signal from the pixel of the i-th row.

Then, the processing proceeds to the AD conversion period. The AD conversion circuit 143 performs the AD conversion on the signal received from the S/H circuit 146, and passes the AD-converted signal to the calculation circuit 147. The calculation circuit 147 refers to the result of the AD conversion by the AD conversion circuit 143 and the value of the flag FL received from the determination circuit 142, and performs a process of increasing the dynamic range. The calculation circuit 147 has been input with the information of the respective accumulation times of the i-th row and the i+1-th row, which is common to all pixel columns. Further, the calculation circuit 147 directly holds a signal from an odd row, and holds a signal from an even row multiplied by the accumulation time ratio.

Accordingly, a signal subjected to the dynamic range increasing process can be obtained as the calculation result of the calculation circuit 147. That is, the column circuit 14A-3 according to the second specific example can also perform the dynamic range increasing process described above relating to the column circuit 14A-3.

Figure 11:
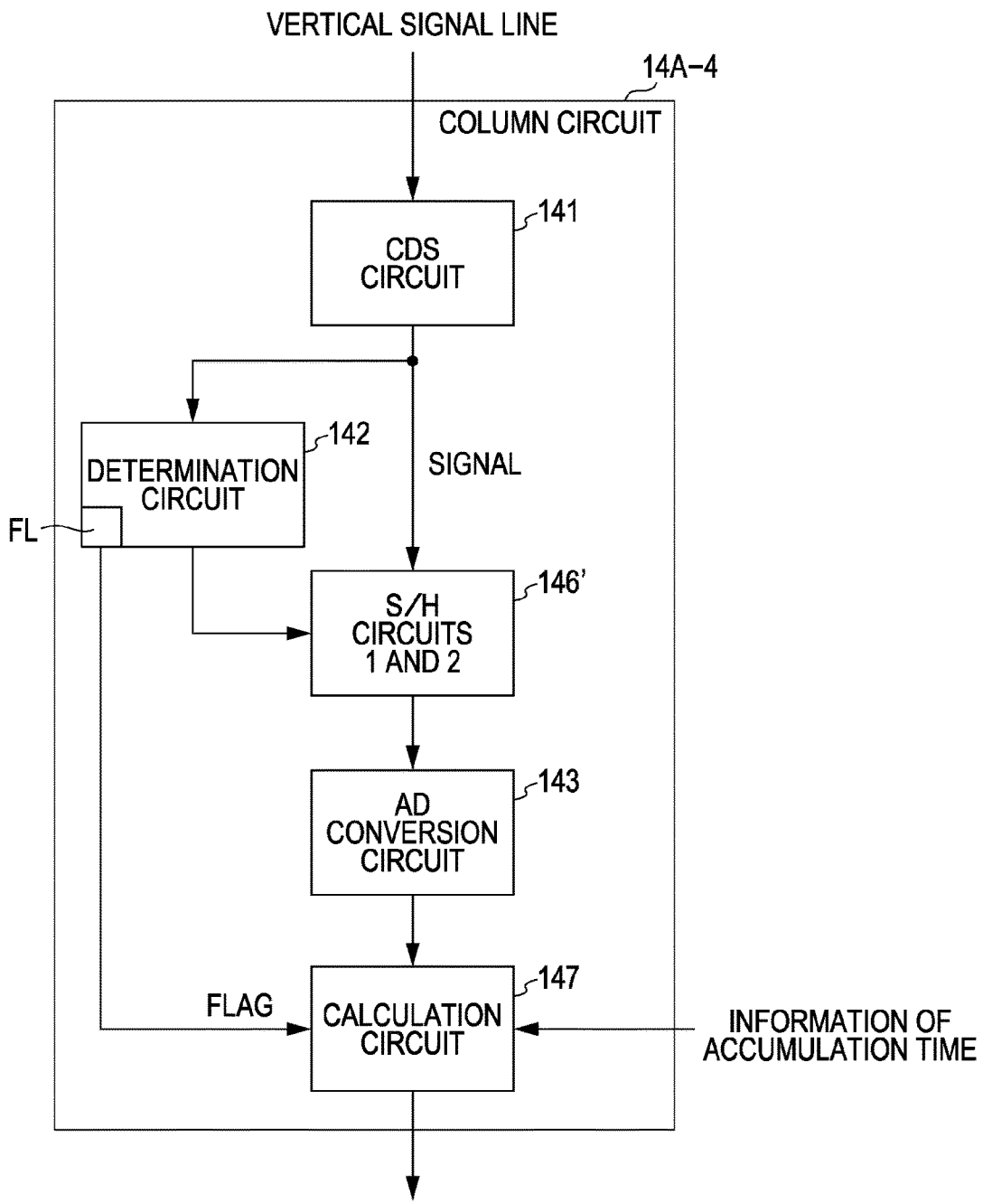
FIG. 11 is a block diagram illustrating a configuration example of a column circuit according to a third specific example of the second modified example.

FIG. 11 is a block diagram illustrating a configuration example of a column circuit 14A-4 according to a third specific example of the second modified example. In the drawing, components equivalent to the components of FIG.

10 are designated by the same reference numerals. In the examples of the column circuit 14A-2 according to the first specific example and the column circuit 14A-3 according to the second specific example, the signals from pixels of different sensitivities in two rows (n=2) are handled. Meanwhile, the example of the column circuit 14A-4 according to the third specific example handles the signals from pixels of different sensitivities in three rows (n=3).

As illustrated in FIG. 11, the column circuit 14A-4 according to the third specific example is configured to include two sample/hold (S/H) circuits 146 (S/H circuits 1 and 2) for each pixel column. The column circuit 14A-4 is basically the same as the column circuit 14A-3 of the second specific example in the other components. Hereinafter, the two S/H circuits 1 and 2 will be collectively described as the S/H circuit 146'.

The signals of the pixels are read out from the pixel array section 12 such that the signals of three pixels of the same color are consecutively read out in the order of the i-th row, the i+1-th row, and the i+2-th row (i represents a multiple of three). Further, the pixel of the i-th row, the signal of which is initially read out among the signals of the three pixels, has the highest sensitivity, and the pixel of the i+2-th row, the signal of which is finally read out among the signals of the three pixels, has the lowest sensitivity.

The operation of the CDS circuit 141 is the same as that of the first embodiment. The determination circuit 142, the AD conversion circuit 143, and the calculation circuit 147 perform the following different operations on the signals from the pixels of the i-th row, the i+1-th row, and the i+2-th row.

[The i-Th Row]

The determination circuit 142 first determines whether or not the signal from the pixel of the i-th row subjected to CDS processing by the CDS circuit 141 has been saturated, and writes the determination result into the flag FL. Similarly as in the second specific example, the determination circuit 142 also controls the S/H circuit 146' (S/H circuits 1 and 2). Specifically, if the signal from the pixel of the i-th row has not been saturated, the determination circuit 142 operates the S/H circuit 1 to hold therein the signal from the pixel of the i-th row. If the signal from the pixel of the i-th row has been saturated, the determination circuit 142 operates neither of the S/H circuits 1 and 2.

[The i+1-Th Row]

The determination circuit 142 refers to the value of the flag FL. If the signal from the pixel of the i-th row has been saturated, the determination circuit 142 causes the S/H circuit 1 to receive the signal from the pixel of the i+1-th row subjected to CDS processing by the CDS circuit 141. If the signal from the pixel of the i-th row has not been saturated, the determination circuit 142 causes the S/H circuit 2 to receive the signal from the pixel of the i+1-th row subjected to CDS processing by the CDS circuit 141.

[The i+2-Th Row]

The determination circuit 142 refers to the value of the flag FL. If the signal from the pixel of the i-th row has been saturated, the determination circuit 142 causes the S/H circuit 2 to receive the signal from the pixel of the i+2-th row subjected to CDS processing by the CDS circuit 141. If the signal from the pixel of the i-th row has not been saturated, the determination circuit 142 operates neither of the S/H circuits 1 and 2.

[AD Conversion and Thereafter]

Then, the AD conversion circuit 143 performs the AD conversion process on the signal held by the S/H circuit 1, and passes the AD-converted signal to the calculation circuit 147. Then, the AD conversion circuit 143 performs the AD conversion process on the signal held by the S/H circuit 2, and passes the AD-converted signal to the calculation circuit 147.

On the basis of the value of the flag FL passed by the determination circuit 142 and the results of two AD conversions by the AD conversion circuit 143, the calculation circuit 147 performs the dynamic range increasing process. The calculation circuit 147 has been input with the information of the respective accumulation times of the i-th row, the i+1-th row, and the i+2-th row, which is common to all columns.

Further, if the signals to be calculated are the signal from the pixel of the i-th row and the signal from the pixel of the i+1-th row, the calculation circuit 147 performs a calculation process of $S_i \times (1-\alpha_1) + S_{i+1} \times r_1 \times \alpha_1$, and holds the calculation result.

Figure 12:
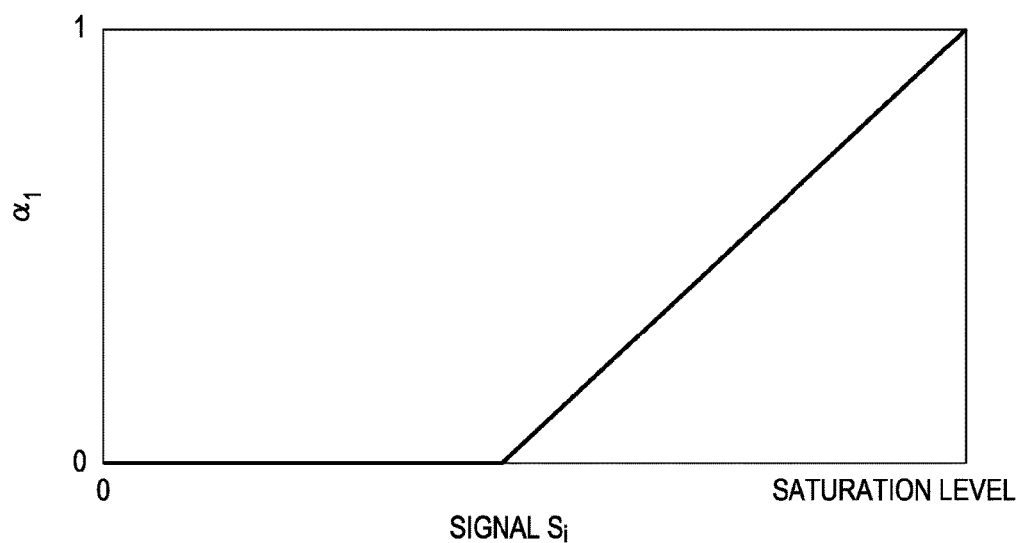
FIG. 12 is a diagram illustrating the relationship between a coefficient used in signal processing of the column circuit according to the third specific example and a signal from a pixel of the i-th row.

Herein, $S_i$ represents the signal of the i-th row, $S_{i+1}$ represents the signal of the i+1-th row, $r_1$ represents the sensitivity ratio between the pixel of the i-th row and the pixel of the i+1-th row, and $\alpha_1$ represents a coefficient. As illustrated in FIG. 12, the coefficient $\alpha_1$ takes a value in a range from zero to one, which is determined by the signal $S_i$ of the i-th row. In a region close to the saturation level, the coefficient $\alpha_1$ is set to a value, with which the contribution ratio is increased (a value close to one). Specifically, the coefficient $\alpha_1$ is zero in a region up to approximately half the saturation level, and linearly changes from zero to one in accordance with the signal $S_i$ of the i-th row in a region higher than approximately half the saturation level.

If the signals to be calculated are the signal from the pixel of the i+1-th row and the signal from the pixel of the i+2-th row, the calculation circuit 147 performs a calculation process of $S_{i+1} \times r_1 \times (1-\alpha_2) + S_{i+2} \times r_2 \times \alpha_2$, and holds the calculation result.

Figure 13:
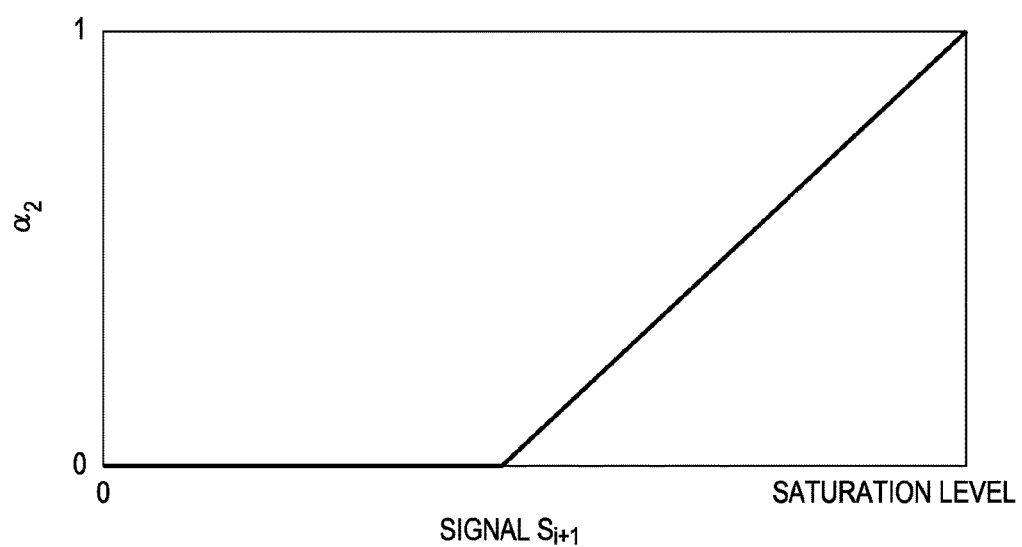
FIG. 13 is a diagram illustrating the relationship between a coefficient used in signal processing of the column circuit according to the third specific example and a signal from a pixel of the i+1-th row.

Herein, $S_{i+2}$ represents the signal of the i+2-th row, $r_2$ represents the sensitivity ratio between the pixel of the i-th row and the pixel of the i+2-th row, and $\alpha_2$ represents a coefficient. As illustrated in FIG. 13, the coefficient $\alpha_2$ takes a value in a range from zero to one, which is determined by the signal $S_{i+1}$ of the i+1-th row. In a region close to the saturation level, the coefficient $\alpha_2$ is set to a value, with which the contribution ratio is increased (a value close to one). Specifically, the coefficient $\alpha_2$ is zero in a region up to approximately half the saturation level, and linearly changes from zero to one in accordance with the signal $S_{i+1}$ of the i+1-th row in a region higher than approximately half the saturation level.

The signals from three pixels are thus processed by the column circuit 14A-4, and the output from the calculation circuit 147 representing the result of the processing is read out to the horizontal bus 18 illustrated in FIG. 1. Thereby, the signals from two pixels out of the three pixels are synthesized and read out.

If the initially read out signal of the high-sensitivity pixel has been saturated, the signal of the high-sensitivity pixel is not subjected to the AD conversion process. Therefore, the signal of the intermediate-sensitivity pixel and the signal of the low-sensitivity pixel are synthesized and output. Further, if the initially read out signal of the high-sensitivity pixel has not been saturated, the signal of the high-sensitivity pixel and the signal of the intermediate-sensitivity pixel are subjected to the AD conversion and synthesized. The signal of the low-sensitivity pixel is not subjected to the AD conversion process. Accordingly, the operations of the AD conversion circuit 143 for three signals are reduced to two AD conversion processes.

FIGS. 14A and 14B are timing charts each illustrating a temporal order of operations of the column circuit 14A-4 according to the third specific example. FIGS. 14A and 14B illustrate two processing examples.

In a first processing example of FIG. 14A, the signals are read out from the pixel of the i-th row to the pixel of the i+2-th row, and thereafter two AD conversions are performed. A second processing example of FIG. 14B is basically the same as the first processing example of FIG. 14A. In the second processing example of FIG. 14B, however, immediately after the read-out of the signal from the pixel of the i+2-th row, the read-out of the signal from the pixel of the i+3-th row is performed such that the AD conversion process is performed in parallel with the read-out process of the signal from the pixel of the i+3-th row.

Herein, as described previously, the saturation refers to the state wherein a signal is mainly at a level at which the signal does not respond substantially linearly to the amount of incident light. In the column processing according to the third specific example, the signals are read out from the pixels in descending order of sensitivity. However, the column processing can also be achieved in a case in which the signals are read out from the pixels in ascending order of sensitivity.

As described above, with the operations of the AD conversion circuit 143 for three signals reduced to two AD conversion processes, the number of AD conversion processes can be reduced. Therefore, the present example can increase the signal processing speed, as compared with the case in which three AD conversion processes are performed on three signals. Further, if the processing speed of the present example is allowed to be the same processing speed (a low speed) as the processing speed of three AD conversion processes performed on three signals, the accuracy of the low-speed signal processing, e.g., the conversion accuracy of the AD conversion process, can be improved. With the reduction in the number of AD conversion processes, lower power consumption can also be achieved.

(Pixel Circuit)

Figure 15:
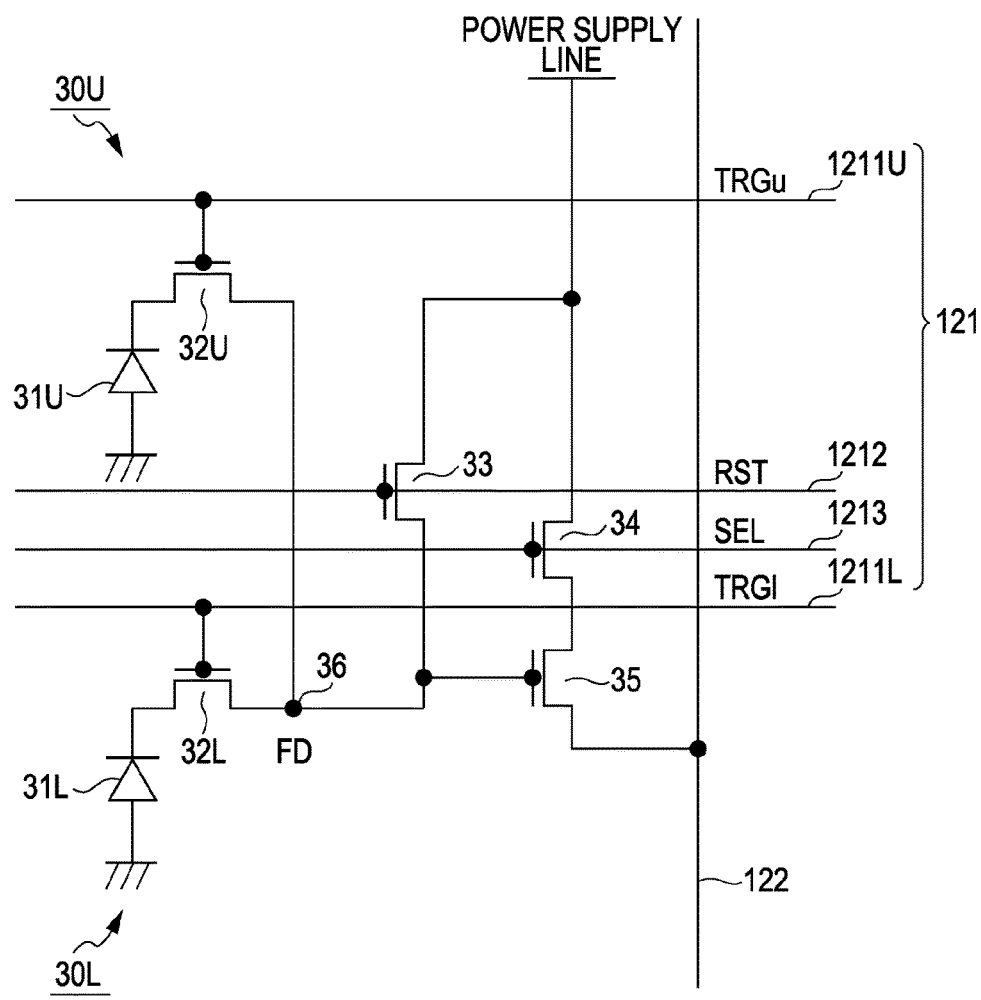
FIG. 15 is a circuit diagram illustrating an example of the configuration of a pixel circuit according to the first embodiment.

FIG. 15 is a circuit diagram illustrating an example of the configuration of a pixel circuit according to the first embodiment. As illustrated in FIG. 15, two upper and lower pixels 30U and 30L include photodiodes (PD) 31U and 31L, which are photoelectric conversion elements, and transmission transistors 32U and 32L, respectively. Further, the two upper and lower pixels 30U and 30L are configured to share some of circuit elements, e.g., three transistors including a reset transistor 33, a selection transistor 34, and an amplifier transistor 35.

In the present example, each of the pixel transistors 32U, 32L, and 33 to 35 uses an N-channel MOS transistor, for example, but is not limited thereto. Further, for drive control of the transmission transistors 32U and 32L, the reset transistor 33, and the selection transistor 34, transmission control lines 1211U and 1211L, a reset control line 1212, and a selection control line 1213 are provided for each of the rows as the previously described pixel drive line 121.

The transmission transistor 32U is connected between the cathode electrode of the photodiode 31U and a floating diffusion (FD: Floating Diffusion Capacitance) 36, and the transmission transistor 32L is connected between the cathode electrode of the photodiode 31L and the floating diffusion 36. The gate electrode of the transmission transistor 32U is supplied with a high-active transmission pulse TRGu through the transmission control line 1211U, and the gate electrode of the transmission transistor 32L is supplied with a high-active transmission pulse TRG1 through the transmission control line 1211L. Thereby, the transmission transistors 32U and 32L transmit to the floating diffusion 36 charges (herein electrons) photoelectrically converted by and accumulated in the photodiodes 31U and 31L, respectively. The floating diffusion 36 functions as a charge-voltage conversion unit which converts the charges into voltage signals.

The drain electrode and the source electrode of the reset transistor 33 are connected to a power supply line of a power supply voltage Vdd and the floating diffusion 36, respectively. The gate electrode of the reset transistor 33 is supplied with a high-active reset pulse RST through the reset control line 1212 prior to the transmission of the charges from the photodiodes 31U and 31L to the floating diffusion 36. Thereby, the reset transistor 33 resets the electric potential of the floating diffusion 36.

The drain electrode and the gate electrode of the selection transistor 34 are connected to the power supply line of the power supply voltage Vdd and the selection control line 1213, respectively. The gate electrode of the selection transistor 34 is supplied with a high-active selection pulse SEL through the selection control line 1213. Thereby, the selection transistor 34 brings the unit pixel (30U or 30L) into the selected state.

The gate electrode, the drain electrode, and the source electrode of the amplifier transistor 35 are connected to the floating diffusion 36, the source electrode of the selection transistor 34, and the vertical signal line 122, respectively. With the unit pixel (30U or 30L) brought into the selected state by the selection transistor 34, the amplifier transistor 35 outputs the signal from the unit pixel (30U or 30L) to the vertical signal line 122.

Specifically, the amplifier transistor 35 outputs, as the reset level, the electric potential of the floating diffusion 36 reset by the reset transistor 33. Further, the amplifier transistor 35 outputs, as the signal level, the electric potential of the floating diffusion 36 after the transmission of the charges thereto from the photodiode 31U or 31L by the transmission transistor 32U or 32L.

In the example described herein, each of the unit pixels 30 is based on a four-transistor configuration including the transmission transistor 32U or 32L, the reset transistor 33, the selection transistor 34, and the amplifier transistor 35. However, the present example is merely one example. That is, the pixel configuration of the unit pixel 30 is not limited to the pixel configuration based on the four-transistor configuration, and thus may be a pixel configuration based on a three-transistor configuration, for example.

Further, in the pixel circuit of the above-described configuration, the selection transistor 34 is connected between the power supply line of the power supply voltage Vdd and the amplifier transistor 35. However, the selection transistor 34 can also be configured to be connected between the amplifier transistor 35 and the vertical signal line 122.

According to the pixel circuit of the above-described configuration, the charges are detected after having been transmitted from the photodiode 31U or 31L to the floating diffusion 36. Therefore, the two pixels 30U and 30L share the same floating diffusion 36 as the destination to which the charges are transmitted. Thereby, the sensitivity characteristic is equalized between the two pixels 30U and 30L. The floating diffusion 36, which is a node connected to the gate electrode of the amplifier transistor 35, has a parasitic capacitance. Thus, it is not particularly necessary to prepare a capacitance element.

As described above, in the CMOS image sensor 10 including the unit pixels 30, which are horizontally long rectangular pixels arranged in rows and columns, it is possible to obtain the following operational effect by using the preferable one of the respective signals from two upper and lower pixels 30U and 30L forming a set. Normally, if a video signal is generated on the basis of a signal selected (or a signal synthesized) from the respective signals of two upper and lower pixels 30U and 30L, the resolution in the vertical direction (the perpendicular direction) is reduced.

In the CMOS image sensor 10 of the above-described configuration, however, the resolution in the vertical direction and the resolution in the horizontal direction are equal, and the two upper and lower pixels 30U and 30L can be handled substantially similarly to a square pixel. In an image, the sampling pitches in the vertical direction are not equal only in the transitional region between the two upper and lower pixels 30U and 30L, in which the signal amount changes. Therefore, a minor process may be additionally performed on the region for the sake of completeness.

Meanwhile, if the pixel pitch in the vertical direction is reduced along with the miniaturization of pixels and becomes less than the resolution of the optical system which receives incident light, the resolution of the CMOS image sensor 10 is determined not by the pixel pitch in the vertical direction but by the resolution of the optical system. Therefore, if the pixel pitch in the vertical direction is less than the resolution of the optical system which receives incident light, it is substantially unnecessary to perform the above-described minor process on the transitional region between the two upper and lower pixels 30U and 30L, in which the signal amount changes.

That is, if the pixels are miniaturized beyond the limit of the resolution and the pixel pitch in the vertical direction becomes less than the resolution of the optical system which receives incident light, the preferable one of the respective signals from the two upper and lower pixels 30U and 30L is used. By so doing, it is possible to improve the imaging characteristic, which is deteriorated at the same resolution in existing techniques. For example, if the signal of either one of the two upper and lower pixels 30U and 30L is a high-sensitivity signal and the signal of the other pixel is a low-sensitivity signal, and if the high-sensitivity signal has been saturated, the low-sensitivity signal is used to generate a video signal. Thereby, the dynamic range with respect to the light input can be increased.

MODIFIED EXAMPLES

In many CMOS image sensors, the individual on-chip color filter 40 is provided with on-chip lenses placed thereon for the respective pixels to improve the sensitivity. In the first embodiment, each of the unit pixels 30 has a horizontally long shape. Thus, it is difficult to precisely collect light by using the on-chip lenses. This is because it is difficult to produce a non-circular on-chip lens, and, in the first place, it is difficult to collect light by using a non-circular lens.

First Modified Example

To address the issue of collection of light by using the on-chip lenses, it is preferable to employ, as a back-surface incident type pixel structure or a photoelectric conversion film lamination type pixel structure, a pixel structure having an aperture ratio of 100% and not using the on-chip lenses. The back-surface incident type pixel structure receives incident light from the opposite side to a wiring layer. The photoelectric conversion film lamination type pixel structure performs photoelectric conversion at a photoelectric conversion film laminated on the incident light side of a wiring layer. An example of the back-surface incident type pixel structure will be described below.

Figure 16:
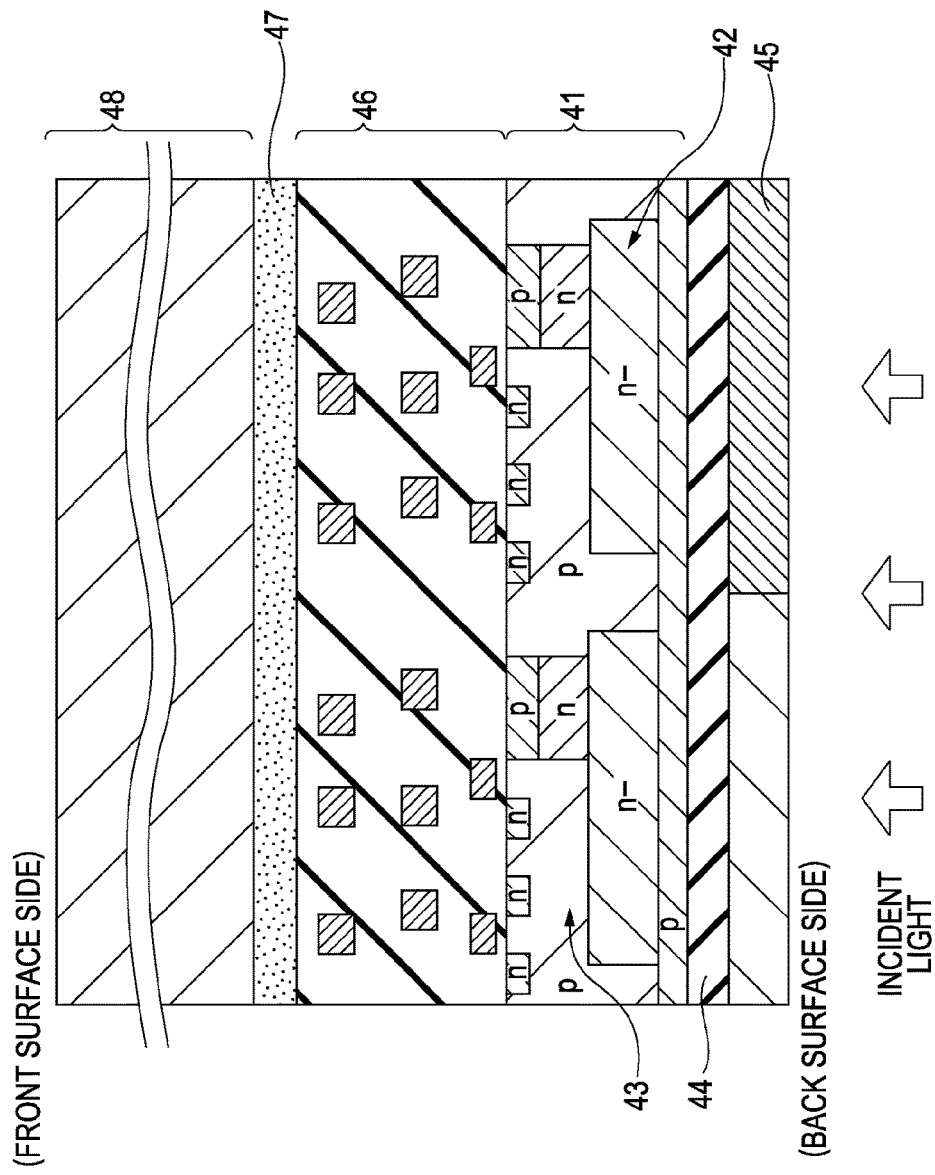
FIG. 16 is a cross-sectional view illustrating an example of a back-surface incident type pixel structure.

FIG. 16 is a cross-sectional view illustrating an example of the back-surface incident type pixel structure. Herein, a cross-sectional structure of two pixels is illustrated.

In FIG. 16, photodiodes 42 and pixel transistors 43 are formed in a silicon portion 41. That is, the silicon portion 41 is a device forming portion. Herein, the photodiodes 42 correspond to the photodiodes 31U and 31L of FIG. 15. Further, the pixel transistors 43 correspond to the transistors 32U, 32L, and 33 to 35 of FIG. 15.

On one side of the silicon portion 41, color filters 45 are formed with the interposition of an interlayer film 44. With this structure, light incident from the one side of the silicon portion 41 is guided onto the respective light receiving surfaces of the photodiodes 42 via the color filters 45. On the other side of the silicon portion 41, a wiring portion 46 is formed in which the respective gate electrodes of the pixel transistors 43 and metal wirings are provided. A surface of the wiring portion 46 away from the silicon portion 41 is pasted with a supporting substrate 48 by an adhesive agent 47.

In the above-described pixel structure, the silicon portion 41 formed with the photodiodes 42 and the pixel transistors 43 has a side facing the wiring portion 46, which will be referred to as the front surface side, and a side away from the wiring portion 46, which will be referred to as the back surface side. On the basis of the above-described definitions, the present pixel structure, in which incident light is received from the back surface side of the silicon portion 41, is the back-surface incident type pixel structure.

According to the back-surface incident type pixel structure, incident light is received from the opposite side to the wiring portion 46, and thus the aperture ratio can be increased to 100%. Further, the wiring portion 46 is not located on the incident light receiving side. Therefore, incident light can be collected on the respective light receiving surfaces of the photodiodes 42 without the use of the on-chip lenses. As a result, the present example can address the issue of collection of light by the use of the on-chip lenses, which arises when each of the unit pixels 30 is a rectangular pixel having different sizes in the vertical and horizontal directions.

Second Modified Example

Figure 17:
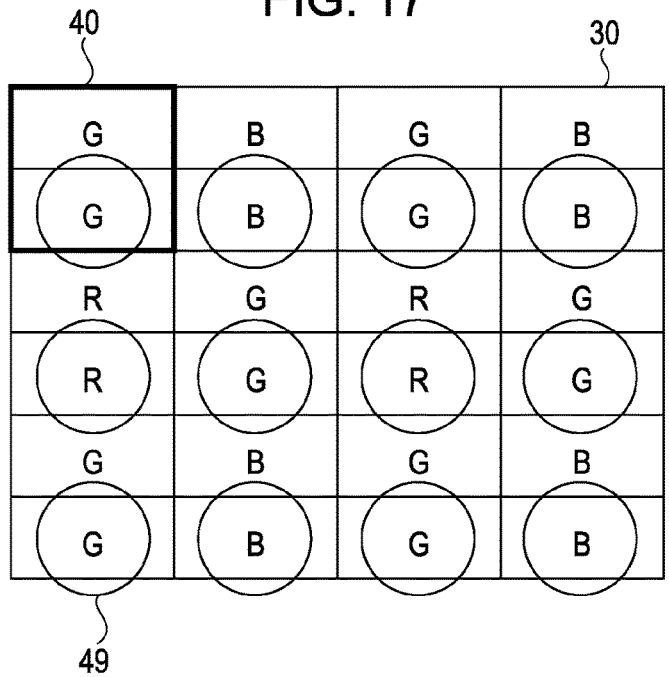
FIG. 17 is a configuration diagram illustrating a modified example of the first embodiment.

In the above-described first embodiment, the shutter scanning is performed separately on the odd row and the even row to cause a difference in the accumulation time and thus provide the two upper and lower pixels with different sensitivities. Alternatively, another method of providing different sensitivities may be employed. For example, ND (Neutral Density) filters may be pasted only on the even rows, or on-chip lenses 49 may be provided only to the unit pixels 30 in the odd rows, as illustrated in FIG. 17, to thereby provide the two upper and lower pixels with different sensitivities. Herein, the ND filter refers to a light amount adjusting filter which substantially uniformly reduces the amount of visible-range light without affecting the color.

Second Embodiment

Figure 18:
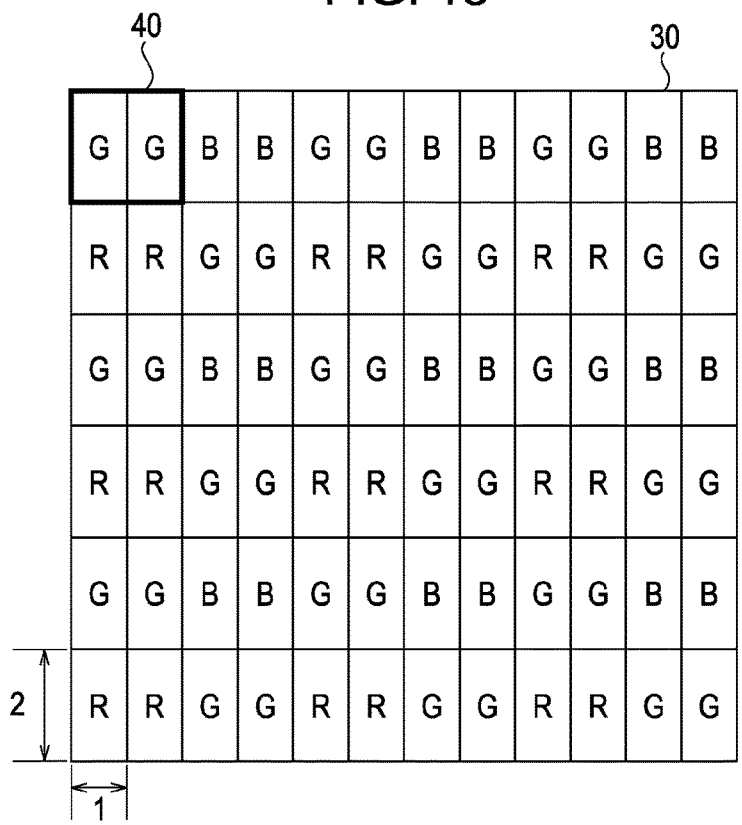
FIG. 18 is a configuration diagram illustrating an example of a pixel array in a pixel array section according to a second embodiment.

FIG. 18 is a configuration diagram illustrating an example of the pixel array in the pixel array section 12 according to a second embodiment. As illustrated in FIG. 18, the pixel array section 12 includes unit pixels 30 each including a photoelectric conversion element and two-dimensionally arranged in multiple rows and columns. Herein, each of the unit pixels 30 is a so-called vertically long rectangular pixel, which is twice as long in the vertical size (in the column direction) as in the horizontal size (in the row direction), i.e., which has a vertical-to-horizontal pitch ratio of 2:1.

If the CMOS image sensor 10 is capable of picking up a color image, a plurality, e.g., two of the unit pixels 30 adjacent in the horizontal direction form a set. The set of two left and right pixels is provided with the on-chip color filter 40 of the same color. Specifically, each of the odd rows includes a color array of repeated GGBB combinations, and each of the even rows includes a color array of repeated RRGG combinations. The two left and right pixels are the same in color. Therefore, one color filter can cover the two left and right pixels.

In the pixel array of the pixel array section 12, each of the unit pixels 30 is a vertically long rectangular pixel having the vertical-to-horizontal size ratio of 2:1. As illustrated in FIG. 18, therefore, the shape of the individual on-chip color filter 40 for a set of two left and right pixels is square. The square on-chip color filters 40 are provided to the pixel array in which two columns of color arrays of repeated GR combinations and two columns of color arrays of repeated BG combinations alternate. Therefore, the overall color array of the on-chip color filters 40 is a Bayer array.

With the on-chip color filters 40 configured to have the color array based on the units of two pixels, an advantage similar to the advantage of the first embodiment is obtained. That is, along with the miniaturization of the CMOS process, pixels have been increasingly miniaturized. However, it has become increasingly difficult to miniaturize a color filter in accordance with the miniaturization of pixels. This is because it is difficult to miniaturize a color filter while preventing rounding and peeling-off of corners thereof and at the same time maintaining the spectroscopic characteristic thereof. The on-chip color filter 40 of the above-described configuration example, however, can be formed into the size of two pixels combined, and thus is advantageous in terms of the miniaturization of pixels.

(Scanning Method)

Figure 19:
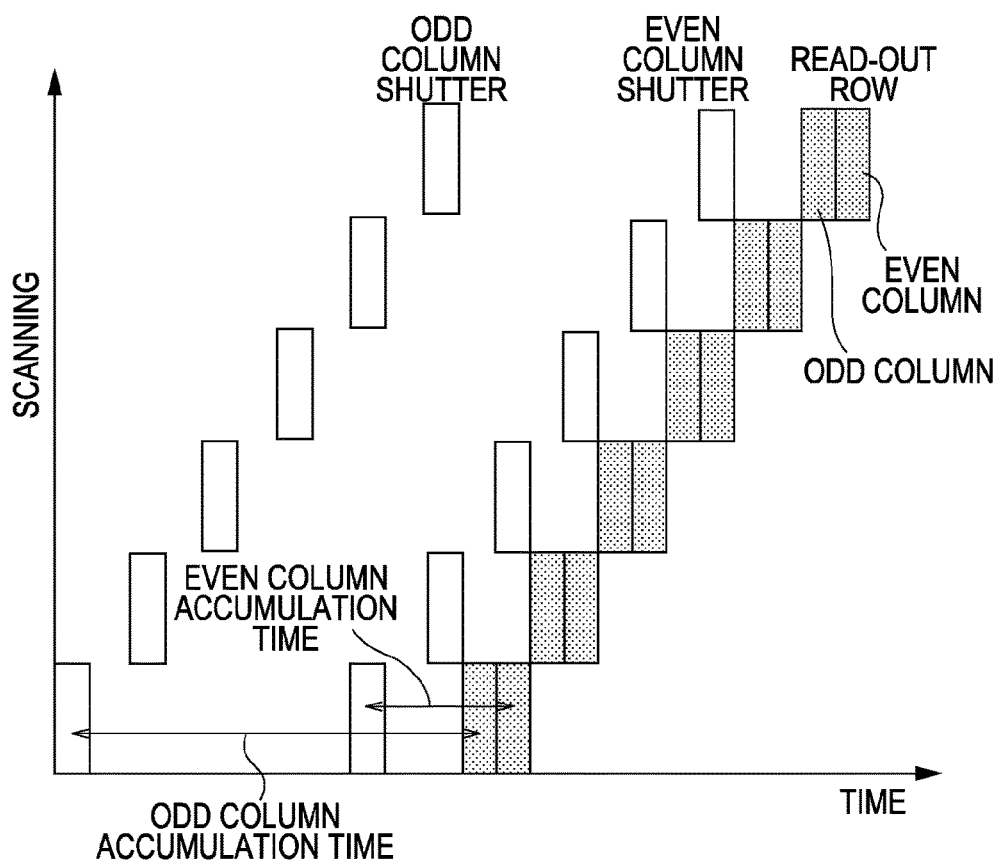
FIG. 19 is a conceptual diagram illustrating the procedure of a scanning method performed on the pixel array in the pixel array section according to the second embodiment.

With reference to FIG. 19, description will now be made of a scanning method performed on the pixel array of the pixel array section 12 according to the second embodiment, i.e., the pixel array in which two columns of color arrays of repeated GR combinations and two columns of color arrays of repeated BG combinations alternate. The scanning is performed under the driving operation by the vertical drive section 13 of FIG. 1.

The scanning according to the second embodiment is performed on different electronic shutter rows between the even columns and the odd columns. Thereby, the even columns and the odd columns have different accumulation times and thus different sensitivities. The read-out operation is performed twice on each of the rows, i.e., first on the odd columns and then on the even columns. In the present example, the signal from each of the pixels in the odd columns is a high-sensitivity signal corresponding to the long-time accumulation, and the signal from each of the pixels in the even columns is a low-sensitivity signal corresponding to the short-time accumulation.

(Pixel Circuit)

Figure 20:
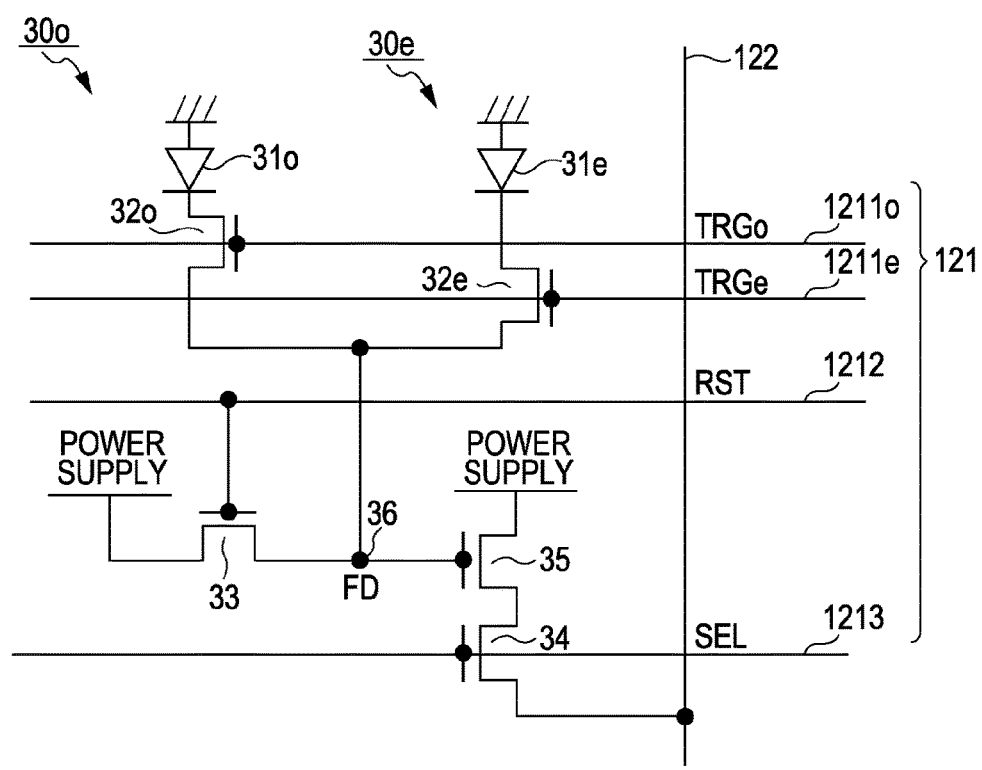
FIG. 20 is a circuit diagram illustrating an example of the configuration of a pixel circuit according to the second embodiment.

FIG. 20 is a circuit diagram illustrating an example of the configuration of a pixel circuit according to the second embodiment. In the drawing, components equivalent to the components of FIG. 15 are designated by the same reference numerals.

As illustrated in FIG. 20, the pixel circuit according to the second embodiment is configured such that two adjacent left and right pixels of the same color share a part of the circuit to equalize the offset and the sensitivity characteristic between the two left and right pixels, and to perform the shutter operation and the read-out operation separately on the odd column and the even column. Hereinafter, the pixel 30 on the left side and the pixel 30 on the right side will be referred to as the odd-column pixel 30o and the even-column pixel 30e, respectively.

Specifically, the two left and right pixels 30o and 30e include photodiodes (PD) 31o and 31e and transmission transistors 32o and 32e, respectively. Further, the two pixels 30o and 30e share some of circuit elements, e.g., three transistors including the reset transistor 33, the selection transistor 34, and the amplifier transistor 35.

Normally, the pixels in the same row are driven by the same line, as in the first embodiment. In the second embodiment, however, the odd column and the even column are assigned with different lines for driving the respective gate electrodes of the transmission transistors 32 (32o and 32e). Specifically, the gate electrode of the transmission transistor 32o of the odd-column pixel 30o is driven by a transmission line 1211o for the odd column, and the gate electrode of the transmission transistor 32e of the even-column pixel 30e is driven by a transmission line 1211e for the even column.

The connection relationship between the reset transistor 33, the selection transistor 34, and the amplifier transistor 35 is basically the same as the connection relationship in the pixel circuit according to the first embodiment. In the pixel circuit according to the second embodiment, however, the selection transistor 34 is connected between the amplifier transistor 35 and the vertical signal line 122. Meanwhile, in the pixel circuit according to the first embodiment, the selection transistor 34 is connected between the power supply line of the power supply voltage Vdd and the amplifier transistor 35. The pixel circuit according to the second embodiment may be alternately configured such that the selection transistor 34 is connected between the power supply line of the power supply voltage Vdd and the amplifier transistor 35, similarly as in the pixel circuit according to the first embodiment.

In the pixel circuit of the above-described configuration, in the shutter operation on the odd column, the gate electrode of the reset transistor 33 is supplied with a high-active reset pulse RST, and the gate electrode of the transmission transistor 32o for the odd column is supplied with a high-active transmission pulse TRGo. Thereby, the charges of the floating diffusion 36 are removed, and thereafter the accumulation of the odd column is started. Meanwhile, in the shutter operation on the even column, the gate electrode of the reset transistor 33 is supplied with a high-active reset pulse RST, and the gate electrode of the transmission transistor 32e for the even column is supplied with a high-active transmission pulse TRGe. Thereby, the charges of the floating diffusion 36 are removed, and thereafter the accumulation of the even row is started.

(Column Processing Section)

Figure 21:
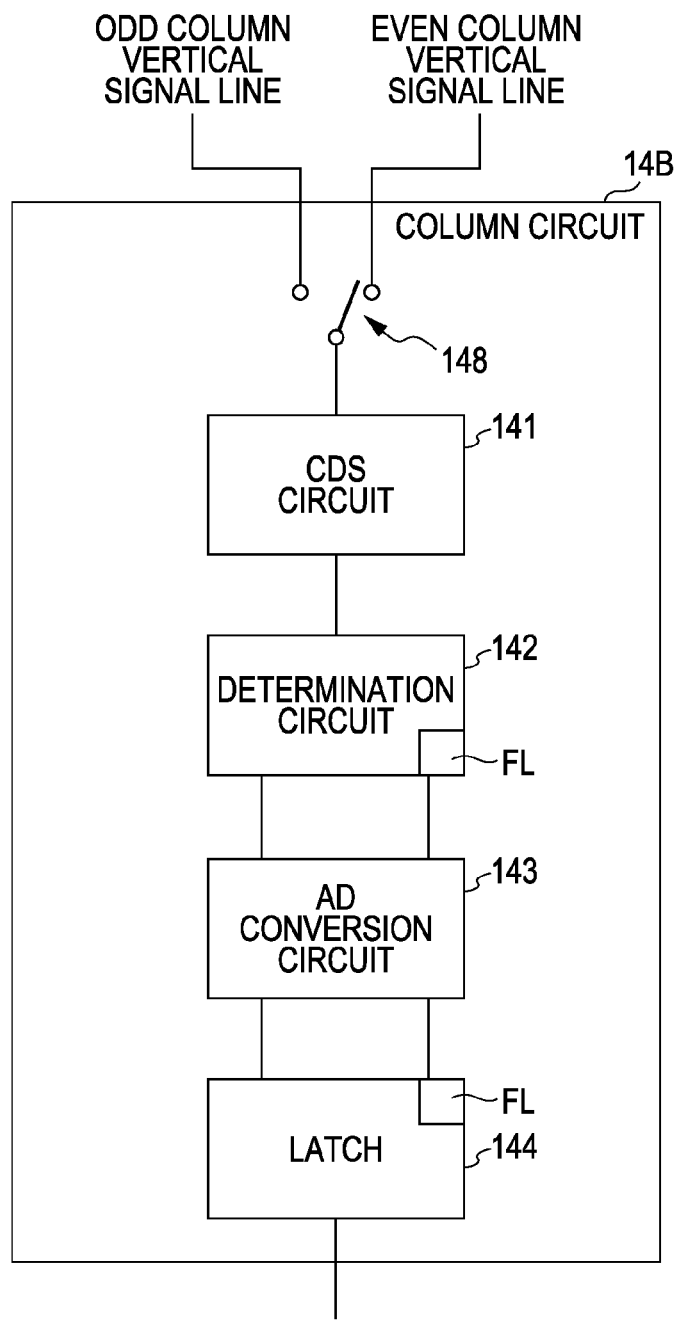
FIG. 21 is a block diagram illustrating an example of the configuration of a column circuit according to the second embodiment.

FIG. 21 is a block diagram illustrating an example of the configuration of a column circuit 14B according to the second embodiment. In the drawing, components equivalent to the components of FIG. 4 are designated by the same reference numerals.

In the second embodiment, the two adjacent left and right pixels 30o and 30e form a set. Therefore, the column circuit 14B according to the second embodiment is provided for each two adjacent columns. Further, the column circuit 14B is configured to include the CDS circuit 141, the determination circuit 142, the AD conversion circuit 143, and the latch 144, and also include a selection section 148 provided to an input section of the column circuit 14B and formed by, for example, a switch for selecting between the odd column and the even column.

The selection section 148 first selects the signal from the odd column and then selects the signal from the even column. Due to the selection by the selection section 148, the signal from the odd column and the signal from the even column are sequentially processed by the CDS circuit 141, the determination circuit 142, the AD conversion circuit 143, and the latch 144. The CDS circuit 141, the determination circuit 142, the AD conversion circuit 143, and the latch 144 perform processing operations similar to the processing operations of the first embodiment.

As described above, according to the CMOS image sensor 10 including the unit pixels 30, which are vertically long rectangular pixels having the vertical-to-horizontal size ratio of 2:1 and arranged in rows and columns, even if the pixels are miniaturized beyond the limit of the resolution and the pixel pitch in the horizontal direction becomes less than the resolution of the optical system which receives incident light, the imaging characteristic can be improved. For example, if the signal of either one of the two left and right pixels 30o and 30e is a high-sensitivity signal and the signal of the other pixel is a low-sensitivity signal, and if the high-sensitivity signal has been saturated, the low-sensitivity signal is used to generate a video signal. Thereby, the dynamic range with respect to the light input can be increased.

Third Embodiment

In the second embodiment, a part of the pixel circuit is shared by the two left and right pixels 30o and 30e. Meanwhile, the third embodiment assumes a large-sized CMOS image sensor, and is configured such that a part of the pixel circuit is not shared by the two left and right pixels 30o and 30e. In a configuration affording an extra process, as in a large-sized CMOS image sensor, the offset and the sensitivity characteristic can be equalized between the two adjacent left and right pixels 30o and 30e, even if the pixels 30o and 30e do not share a part of the pixel circuit. The present embodiment is the same as the second embodiment in the pixel array and the color coding.

(Pixel Circuit)

Figure 22:
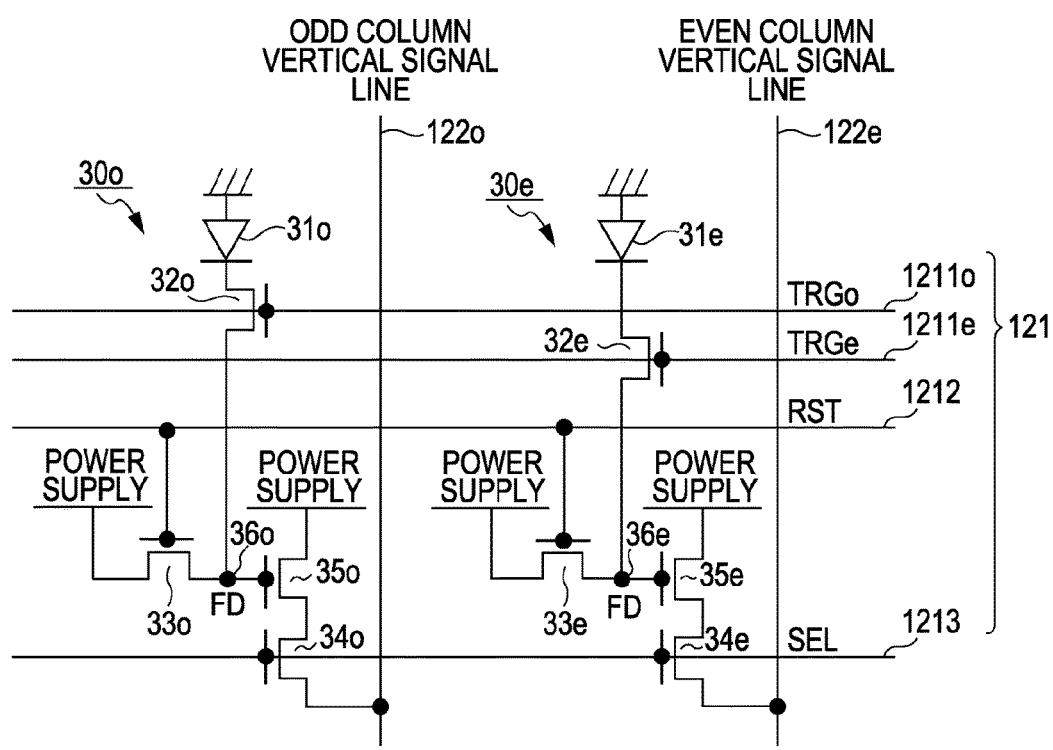
FIG. 22 is a circuit diagram illustrating an example of the configuration of a pixel circuit according to a third embodiment.

FIG. 22 is a circuit diagram illustrating an example of the configuration of the pixel circuit according to the third embodiment. In the drawing, components equivalent to the components of FIG. 20 are designated by the same reference numerals.

As illustrated in FIG. 22, in the pixel circuit according to the third embodiment, the two left and right pixels 30o and 30e do not share a part of the pixel circuit, but the odd column and the even column of the same row are assigned with different lines for driving the respective gate electrodes of the transmission transistors 32o and 30e. Specifically, the gate electrode of the odd-column pixel 30o is driven by the transmission line 1211o for the odd column, and the gate electrode of the even-column pixel 30e is driven by the transmission line 1211e for the even column. The respective signals (of the signal level and the reset level) from the two left and right pixels 30o and 30e are read out to different vertical signal lines 122o and 122e for the odd column and the even column, respectively.

(Scanning Method)

Figure 23:
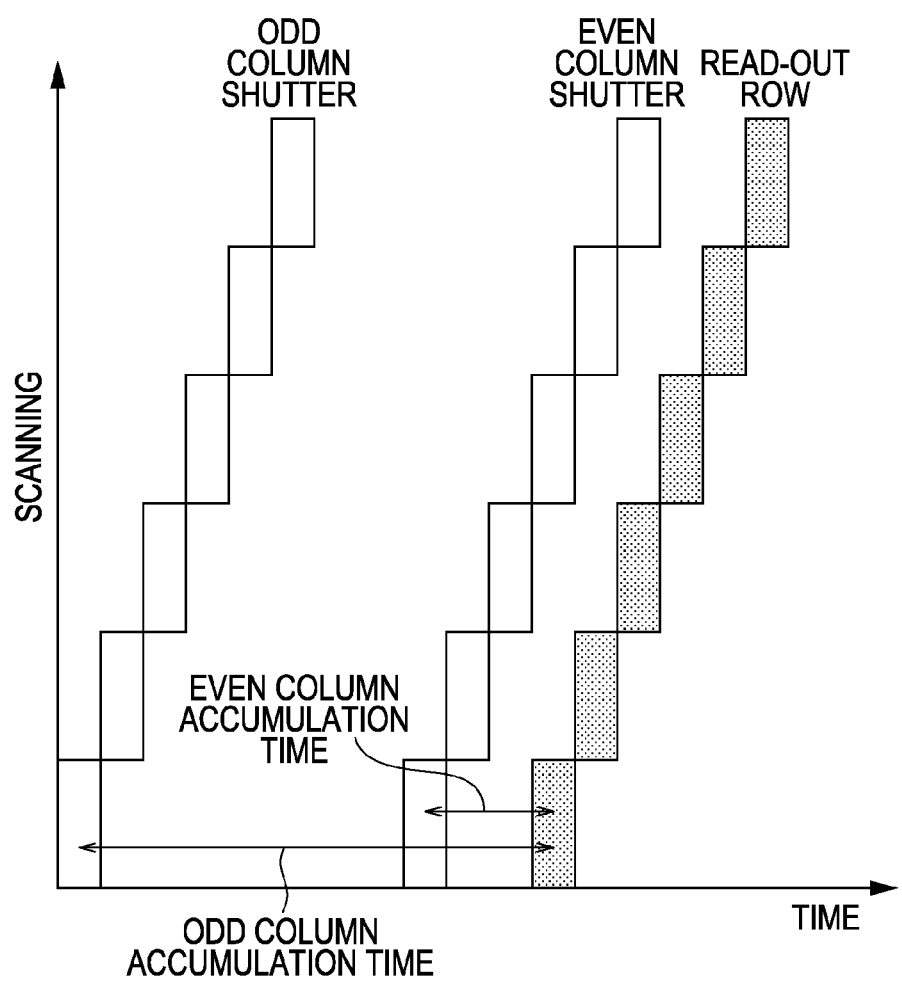
FIG. 23 is a conceptual diagram illustrating the procedure of a scanning method performed on a pixel array in a pixel array section according to the third embodiment.

With the transmission and driving operation performed through the different transmission lines 1211o and 1211e for the odd column and the even column in the same row, respectively, it is possible to separately scan the odd column and the even column in the shutter operation, and to simultaneously scan the odd column and the even column in the read-out operation. FIG. 23 illustrates the procedure of the scanning. As illustrated in FIG. 23, the shutter operation is performed separately on the odd columns and the even columns, but the read-out operation is performed at the same time on each of the rows.

(Column Processing Section)

Figure 24:
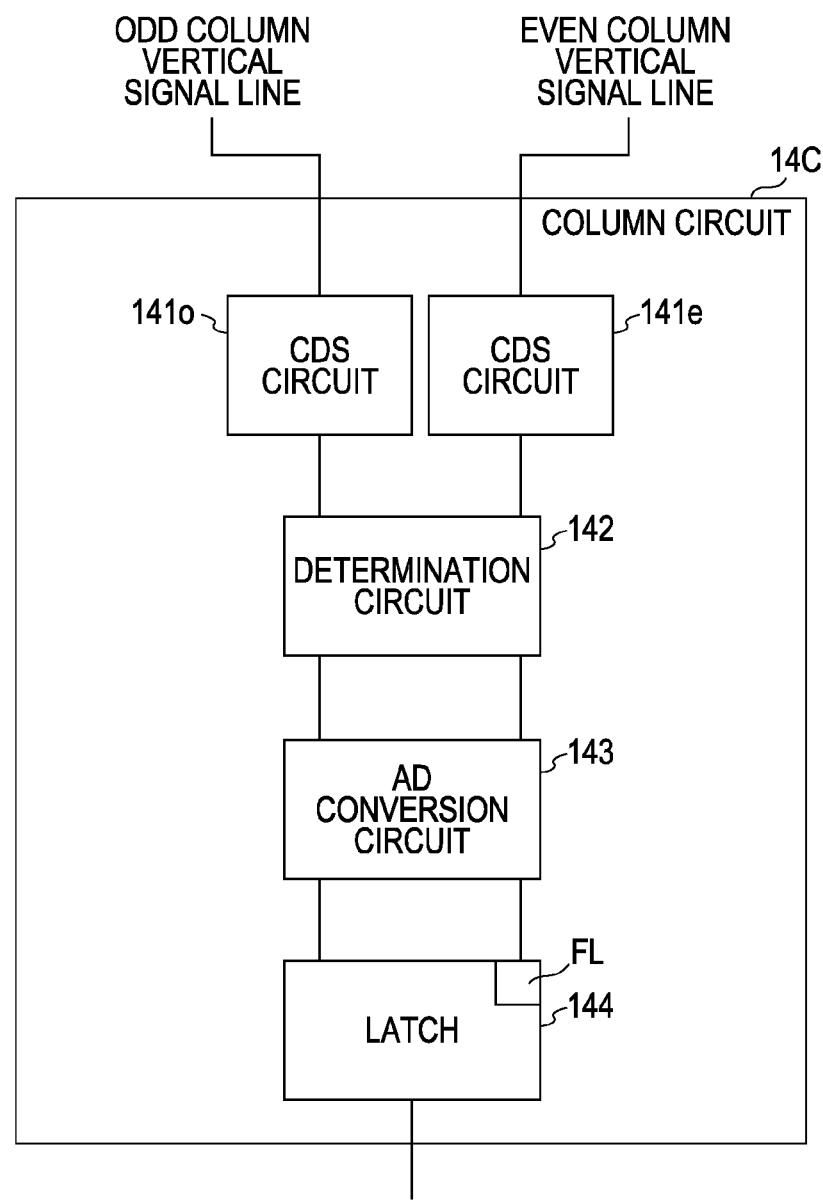
FIG. 24 is a block diagram illustrating an example of the configuration of a column circuit according to the third embodiment.

FIG. 24 is a block diagram illustrating an example of the configuration of a column circuit 14C according to the third embodiment. In the drawing, components equivalent to the components of FIG. 4 are designated by the same reference numerals.

In the third embodiment, the signal level and the reset level are supplied through the different vertical signal lines 122o and 122e in the two left and right pixels 30o and 30e, respectively. Therefore, the column circuit 14C according to the third embodiment is configured to include different CDS circuits 141o and 141e for the odd column and the even column, respectively.

In the column circuit 14C, the CDS circuits 141o and 141e perform denoising processing on the odd column and the even column, respectively, and supply the determination circuit 142 with the denoised signal of the odd column and the denoised signal of the even column, respectively. The determination circuit 142 determines which one of the signal of the odd column and the signal of the even column is to be used. For example, if the signal of the odd column corresponding to the long-time accumulation has not reached the saturation level, the signal of the odd column is to be used. If the signal of the odd column has reached the saturation level, the signal of the even column is to be used. Then, the determination circuit 142 selects the signal to be used, and outputs the signal and the determination result.

The AD conversion circuit 143 performs AD conversion on the signal supplied by the determination circuit 142, and writes the AD-converted signal into the latch 144. The determination result is written via the AD conversion circuit 143 into the latch 144 as the flag FL. Then, the determination result and the signal are processed at a subsequent stage to obtain an image having an increased dynamic range. As compared with the second embodiment, the present embodiment performs only one read-out operation on each of the rows, and thus is advantageous in terms of high-speed processing.

Also in the third embodiment, operational effects similar to the operational effects of the second embodiment can be obtained. For example, if the signal of either one of the two left and right pixels 30o and 30e is a high-sensitivity signal and the signal of the other pixel is a low-sensitivity signal, and if the high-sensitivity signal has been saturated, the low-sensitivity signal is used to generate a video signal. Thereby, the dynamic range with respect to the light input can be increased.

3. MODIFIED EXAMPLES

The first to third embodiments described above are configured such that the rectangular pixels each having the vertical-to-horizontal size ratio of 1:2 (2:1) are used as the unit pixels 30, and that each two upper and lower or left and right ones of the unit pixels 30 form a set. The configuration, however, is not limited thereto. For example, the configuration can be modified such that the vertical-to-horizontal size ratio of the pixels is set to be 1:3 or 1:4, and that each three or four vertically or horizontally adjacent ones of the pixels form a set. With this configuration, a signal from the three or four pixels can be handled.

Further, the first to third embodiments are configured to output the signal of either one of the two pixels forming a set. The configuration may be modified to synthesize a single signal from the respective signals of the two pixels. If a single signal is thus selected or synthesized from the signals of the plurality of pixels forming a set, a signal resembling the signal from a square pixel can be obtained.

Further, in the first to third embodiments, description has been made of the signal processing performed to increase the dynamic range, for example. The signal processing, however, is not limited to this example. For example, when two pixels form a set, the signal from one of the pixels may be used as a subject signal based on light reflected by a subject when light is emitted from a light source such as a light-emitting diode and applied to the subject to detect an object. Further, the signal from the other pixel may be used as a background signal based on background light of the subject. Then, if subtraction processing is performed on the respective signals from the two pixels to remove the background light from the subtraction result, a signal looking like the signal from a square pixel (a square grid) can be obtained.

As described above, in addition to the application example for increasing the dynamic range, a variety of other applications are conceivable. In any case, when the signal from the two pixels is handled as the signal from a square pixel, it is preferable that the shorter one of the pixel pitch in the vertical direction and the pixel pitch in the horizontal direction of the pixel array is equal to or less than the resolution of the optical system which receives incident light.

Figure 25:
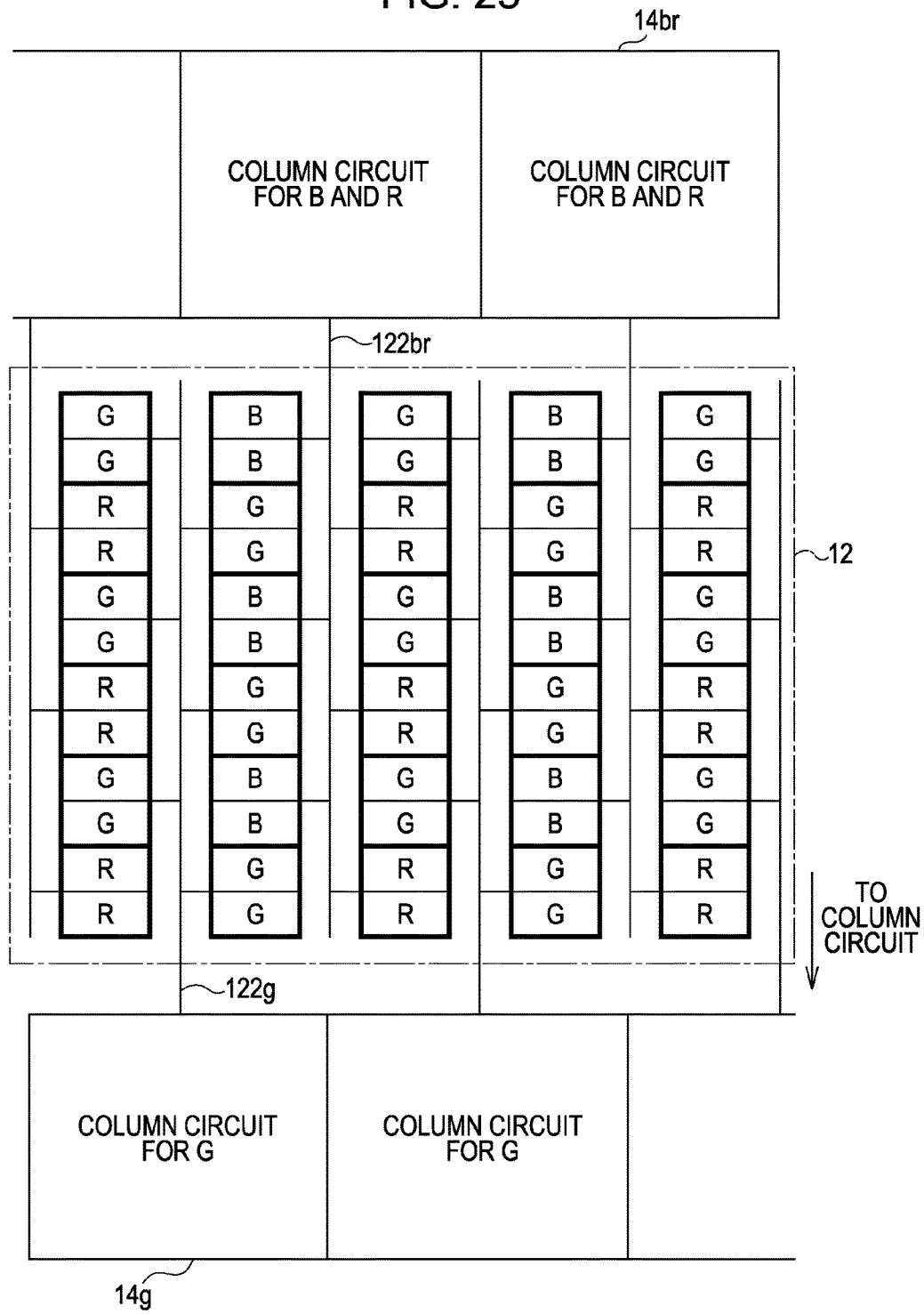
FIG. 25 is a configuration diagram illustrating a modified example of a signal read-out system.

Further, the first to third embodiments are configured to read out the signals from the R, G, and B pixels to the common vertical signal line 122. The configuration can be modified to read out the signals from the R, G, and B pixels to different vertical signal lines. For example, as illustrated in FIG. 25, the signals from the G pixels and the signals from the B and R pixels may be read out to different vertical signal lines 122g and 122br, respectively.

In this case, for example, column circuits 14g for the G pixels are provided on the lower side of the pixel array section 12, and column circuits 14br for the B and R pixels are provided on the upper side of the pixel array section 12. Further, the signals from the G pixels are read out to the lower side of the drawing through the vertical signal lines 122g, while the signals from the B and R pixels are read out to the upper side of the drawing through the vertical signal lines 122br. Then, signal processing such as denoising is performed at the column circuits 14g and 14br, respectively.

Further, in the first to third embodiments, description has been made of the example in which the present invention is applied to a CMOS image sensor capable of picking up a color image. However, the present invention is similarly applicable to a CMOS image sensor capable of picking up a monochrome image.

The above description has been made of the example in which the present invention is applied to a CMOS image sensor which includes unit pixels arranged in rows and columns and detecting, as a physical quantity, signal charges according to the light amount of visible light. The application of the present invention, however, is not limited to the CMOS image sensor. Thus, the present invention can be applied to solid-state imaging devices in general, such as a CCD image sensor.

The solid-state imaging devices may be embodied as one chip, or as a module having an imaging function and including an imaging section and a signal processing section or an optical system as one package.

4. ELECTRONIC APPARATUS

The solid-state imaging devices according to the embodiments of the present invention can be installed and used in electronic apparatuses in general which use a solid-state imaging device in an image capture unit (a photoelectric conversion unit) thereof. The electronic apparatuses include an imaging apparatus (a camera system) such as a digital still camera and a video camera, a mobile terminal apparatus having an imaging function such as a mobile phone, a copier using a solid-state imaging device in an image reading unit thereof, and so forth. In some cases, the above-described module-like embodiment installed in an electronic apparatus, i.e., a camera module forms an imaging apparatus.

(Imaging Apparatus)

FIG. 26 is a block diagram illustrating an example of the configuration of one of electronic apparatuses, e.g., an imaging apparatus, according to an embodiment of the present invention. As illustrated in FIG. 26, an imaging apparatus 100 according to the embodiment of the present invention includes an optical system including a lens group 101 and so forth, an imaging device 102, a DSP circuit 103 serving as a camera signal processing unit, a frame memory 104, a display device 105, a recording device 106, an operation system 107, a power supply system 108, and so forth. The imaging apparatus 100 is configured such that the DSP circuit 103, the frame memory 104, the display device 105, the recording device 106, the operation system 107, and the power supply system 108 are connected to one another via a bus line 109.

The lens group 101 receives incident light from a subject (image light), and forms an image on an imaging surface of the imaging device 102. The imaging device 102 converts, in units of pixels, the light amount of the incident light formed into the image on the imaging surface by the lens group 101 into electrical signals, and outputs the converted electrical signals as pixel signals. As the imaging device 102, a solid-state imaging device such as the CMOS image sensors 10 according to the forgoing embodiments can be used.

Herein, the shorter one of the pixel pitch in the vertical direction and the pixel pitch in the horizontal direction of the pixel array in the imaging device 102 is equal to or less than the resolution of the optical system including the lens group 101. The DSP circuit 103 receives a pixel signal from the imaging device 102 and a signal indicating whether the pixel signal is a high-sensitivity signal corresponding to the long-time accumulation or a low-sensitivity signal corresponding to the short-time accumulation (the flag FL in FIGS. 4, 21, and 24), and performs signal processing for increasing the dynamic range.

Specifically, if the flag FL supplied by the imaging device 102 indicates that the high-sensitivity signal has not been saturated (FL=0), the DSP circuit 103 generates a video signal by using the high-sensitivity signal provided together with the flag FL as a pair. If the flag FL indicates that the high-sensitivity signal has been saturated (FL=1), the DSP circuit 103 generates a video signal by synthesizing the saturation level with the use of the signal level of the low-sensitivity signal provided together with the flag FL as a pair. With the above-described signal processing, the dynamic range with respect to the light input can be increased.

The processing performed by the DSP circuit 103 is the same as the signal processing performed to process the signal from a square pixel. Needless to say, the processing may be designed in consideration of the actual arrangement of the pixels. However, if the processing is the same as the signal processing performed on the signal from a square pixel, it is unnecessary to change the signal processing designed in consideration of the actual arrangement of the pixels. Therefore, substantially the same image can be generated at a lower cost than in the signal processing designed in consideration of the actual arrangement of the pixels. Further, it is possible to make a plurality of pixels look like a square pixel while reducing the signal amount of the plurality of pixels. Accordingly, the present signal processing can be achieved with lower power consumption, and is highly versatile.

The display device 105 includes a panel-type display device, such as a liquid crystal display device and an organic EL (Electro Luminescence) display device, and displays a moving or still image picked up by the imaging device 102. The recording device 106 records the moving or still image picked up by the imaging device 102 on a recording medium, such as a video tape and a DVD (Digital Versatile Disk).

The operation system 107 issues operation commands relating to a variety of functions of the imaging apparatus 100. The power supply system 108 supplies, as appropriate, the DSP circuit 103, the frame memory 104, the display device 105, the recording device 106, and the operation system 107 with a variety of power supplies serving as operation power supplies therefor.

As described above, if the imaging apparatus 100 such as a camera system and a camera module for a mobile apparatus such as a mobile phone uses the CMOS image sensors 10 according to the forgoing embodiments as the imaging device 102 thereof, the following operational effect can be obtained. That is, even if the shorter one of the pixel pitch in the vertical direction and the pixel pitch in the horizontal direction of the pixel array in the imaging device 102 is equal to or less than the resolution of the optical system including the lens group 101, the imaging characteristic can be improved.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
   a pixel array section having a first photodiode and a second photodiode adjacent to each other;
   a first transfer transistor,
   a second transfer transistor,
   a floating diffusion coupled to the first photodiode through the first transfer transistor and the second photodiode through the second transfer transistor; and
   a first color filter covering the first photodiode and the second photodiode, wherein,
   the first photodiode and the second photodiode are formed in a silicon substrate,
   the first color filter is provided on one side of the silicon substrate,
   each gate electrode of the first and second transfer transistors is provided on the other side of the silicon substrate,
   a center of a microlens is located on one of the first and the second photodiodes,
   sides of each of the first and the second photodiodes in a first direction are different lengths than sides in a second direction that is perpendicular to the first direction, and
   a diameter of the microlens located on the one of the first and second photodiodes is less than the length of the side of the one of the first and second photodiodes in the first direction and is greater than the length of the side of the one of the first and second photodiodes in the second direction.

2. The imaging device according to claim 1, wherein the floating diffusion is electrically connected to a reset transistor and an amplifier transistor.

3. The imaging device according to claim 2, wherein the floating diffusion is electrically connected to a select transistor.

* * * * *